(12) United States Patent
Mishima et al.

(10) Patent No.: US 8,786,044 B2
(45) Date of Patent: Jul. 22, 2014

(54) PHOTOELECTRIC CONVERSION DEVICE AND IMAGING SYSTEM

(71) Applicant: Canon Kabushiki Kaisha, Tokyo (JP)

(72) Inventors: Ryuichi Mishima, Machida (JP); Hideaki Ishino, Fujisawa (JP); Kenji Togo, Kawasaki (JP); Masatsugu Itahashi, Yokohama (JP); Takehito Okabe, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 19 days.

(21) Appl. No.: 13/632,733

(22) Filed: Oct. 1, 2012

(65) Prior Publication Data

US 2013/0087838 A1    Apr. 11, 2013

(30) Foreign Application Priority Data

Oct. 7, 2011    (JP) ................................. 2011-223292

(51) Int. Cl.
*H01L 31/00*    (2006.01)

(52) U.S. Cl.
USPC ......................................... 257/464; 257/462

(58) Field of Classification Search
CPC ..................... H01L 27/1462; H01L 27/14621; H01L 27/14623; H01L 27/148; H01L 27/14818; H01L 31/0216; H01L 31/02164; H01L 31/02165
USPC ............ 257/462, 464; 438/69, 70, 72, 73, 75, 438/78
See application file for complete search history.

(56) References Cited

U.S. PATENT DOCUMENTS

| 6,303,406 | B1 * | 10/2001 | Chen et al. ....................... 438/72 |
| 6,468,826 | B1 * | 10/2002 | Murakami et al. ............... 438/48 |
| 6,833,601 | B2 * | 12/2004 | Murakami ...................... 257/437 |
| 7,300,817 | B2 * | 11/2007 | Murakami ....................... 438/69 |
| 7,342,269 | B1 * | 3/2008 | Yuzurihara ................... 257/292 |
| 7,829,908 | B2 * | 11/2010 | Narui ............................... 257/98 |
| 8,551,873 | B2 * | 10/2013 | Onuki et al. .................. 438/585 |
| 2003/0122209 | A1 * | 7/2003 | Uya ............................... 257/435 |
| 2005/0088551 | A1 | 4/2005 | Lee |
| 2005/0224853 | A1 | 10/2005 | Ohkawa |
| 2006/0208289 | A1 | 9/2006 | Ohkawa |
| 2009/0250778 | A1 | 10/2009 | Shimotsusa |
| 2009/0256226 | A1 | 10/2009 | Tatani |
| 2010/0026866 | A1 | 2/2010 | Matsumoto |

(Continued)

FOREIGN PATENT DOCUMENTS

| JP | 04/084305 A | 3/1992 |
| JP | 10-135506 A | 5/1998 |

(Continued)

*Primary Examiner* — Fernando L Toledo
*Assistant Examiner* — Christine C Lau
(74) *Attorney, Agent, or Firm* — Canon USA, Inc. IP Division

(57) ABSTRACT

A photoelectric conversion device includes a film that covers the photoelectric conversion part and a transfer gate electrode, wherein a first region having a refractive index lower than refractive indices of the film and the photoelectric conversion part, is provided between the film and the photoelectric conversion part, and a second region having a refractive index lower than the refractive indices of the transfer gate electrode and the film, is provided between the film and the top surface of the transfer gate electrode, and wherein $T_1 < T_2 < \lambda/2 - T_1$ is satisfied, where an optical thickness of the first region is $T_1$, an optical thickness of the second region is $T_2$, and a wavelength of a light incident on the photoelectric conversion part is $\lambda$.

20 Claims, 13 Drawing Sheets

(56) References Cited

U.S. PATENT DOCUMENTS

| | | | |
|---|---|---|---|
| 2010/0078744 A1* | 4/2010 | Wano et al. .................. 257/432 |
| 2010/0097512 A1* | 4/2010 | Miyazawa et al. ............ 348/311 |
| 2010/0193669 A1* | 8/2010 | Yamaguchi et al. ....... 250/214.1 |
| 2010/0289939 A1 | 11/2010 | Ogino |
| 2013/0089963 A1* | 4/2013 | Mishima et al. .............. 438/301 |

FOREIGN PATENT DOCUMENTS

| | | |
|---|---|---|
| JP | 2001-111022 A | 4/2001 |
| JP | 2004-221527 A | 8/2004 |
| JP | 2006-13520 A | 1/2006 |
| JP | 2006-261355 A | 9/2006 |
| JP | 2006-351775 A | 12/2006 |
| JP | 2008-91800 A | 4/2008 |
| JP | 2009-252984 A | 10/2009 |
| JP | 2009-272597 A | 11/2009 |
| JP | 2010-56515 A | 3/2010 |
| JP | 2010-87441 A | 4/2010 |
| JP | 2010-123745 A | 6/2010 |
| JP | 2010-267770 A | 11/2010 |
| WO | 2004/084305 A1 | 9/2004 |

* cited by examiner

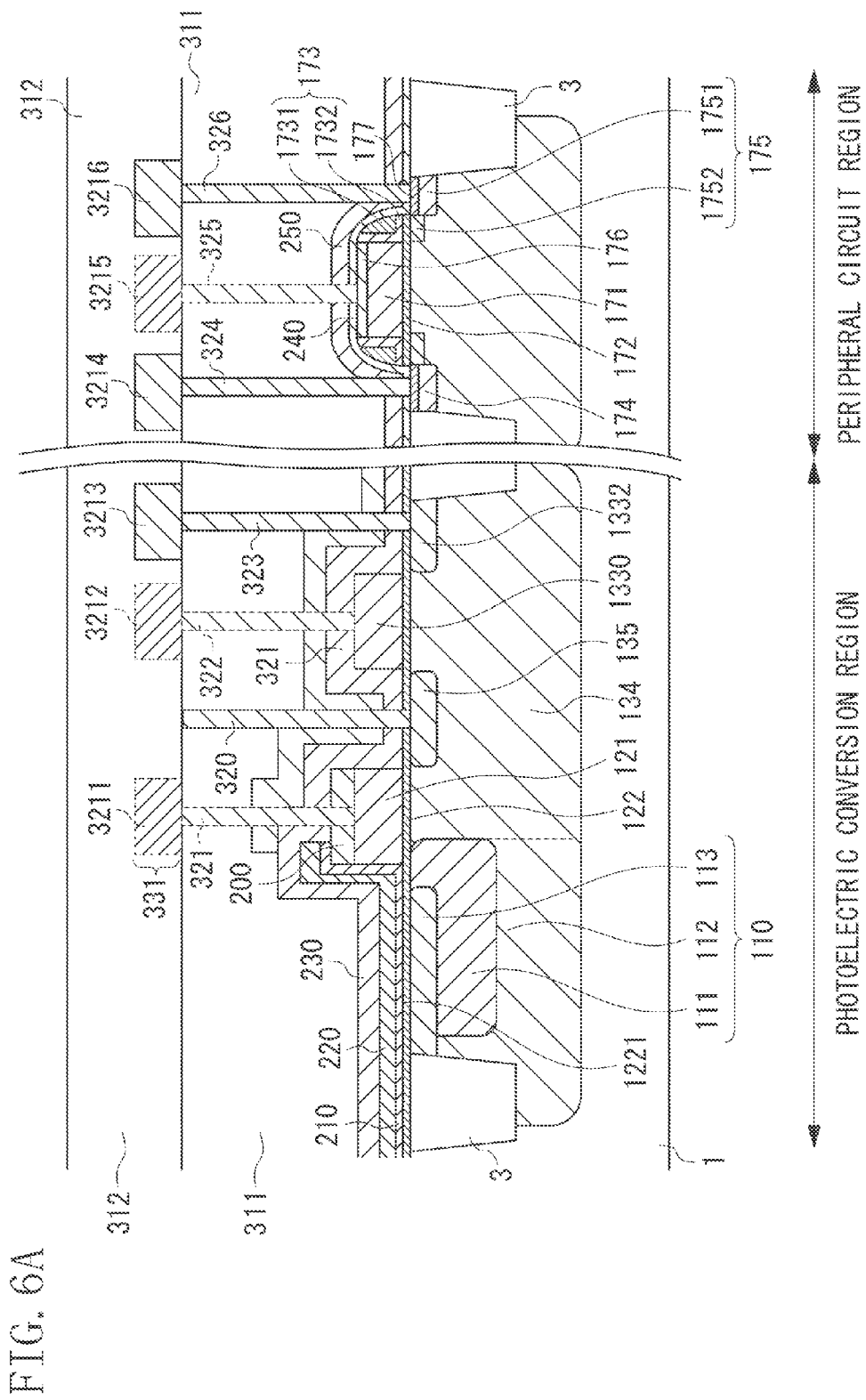

US 8,786,044 B2

PHOTOELECTRIC CONVERSION DEVICE AND IMAGING SYSTEM

BACKGROUND OF THE INVENTION

1. Field of the Invention

One disclosed aspect of the embodiments relates to a photoelectric conversion device provided with a transfer gate that transfers a signal charge to a signal generation part from a photoelectric conversion part.

2. Description of the Related Art

As a photoelectric conversion device such as a complementary metal-oxide semiconductor (CMOS) sensor, the one which has a transfer gate that transfers a signal charge generated by a photoelectric conversion part to a signal generation part that generates an electrical signal based on the signal charge is well-known. As an example of such a photoelectric conversion device, U.S. Pat. No. 7,342,269 may be referred to.

SUMMARY OF THE INVENTION

According to an aspect of the embodiments, a photoelectric conversion device includes a photoelectric conversion part provided in a semiconductor substrate, a signal generation part configured to generate an electrical signal based on a signal charge generated by the photoelectric conversion part, and a transfer gate configured to transfer a signal charge to the signal generation part from the photoelectric conversion part. The photoelectric conversion device further includes a continuous film configured to cover the photoelectric conversion part, and to cover a top surface of a gate electrode of the transfer gate. There is provided a first region configured to have a refractive index lower than refractive indices of the continuous film and the photoelectric conversion part, and to form an interface boundary with the continuous film, between the continuous film and the photoelectric conversion part. There is provided a second region configured to have a refractive index lower than refractive indices of the gate electrode and the continuous film, and to form an interface boundary with the continuous film, between the continuous film and the top surface of the gate electrode. When an optical thickness of the first region is $T_1$, an optical thickness of the second region $T_2$, and a wavelength of an incident light entering the photoelectric conversion part is $\lambda$, $T_1 < T_2 < \lambda/2 - T_1$ ($T_1$ is less than $T_2$ and $T_2$ is less than $\lambda/2 - T_1$) is satisfied.

According to another aspect of the embodiments, a photoelectric conversion device includes a photoelectric conversion part provided in a silicon substrate, a signal generation part configured to generate an electrical signal based on a signal charge generated by the photoelectric conversion part, a transfer gate configured to transfer the signal charge to the signal generation part from the photoelectric conversion part, and a color filter provided on the photoelectric conversion part. The photoelectric conversion device further includes a silicon nitride film configured to cover the photoelectric conversion part, and to cover a top surface of a gate electrode of the transfer gate made of polysilicon. There is provided a first region composed of at least one of silicon oxide and silicon nitride-oxide, and configured to form an interface boundary with the silicon nitride film, between a portion that covers the photoelectric conversion part of the silicon nitride film and the photoelectric conversion part. There is provided a second region composed of at least one of silicon oxide and silicon nitride-oxide, and configured to form an interface boundary with the silicon nitride film, between the silicon nitride film and the top surface of the gate electrode. A color filter is provided on the photoelectric conversion part. When a physical thickness of the first region is $D_1$, and a physical thickness of the second region is $D_2$, $D_1 \leq 28$ nm ($D_1$ is less than or equal to 28 nm), and, $D_1 < D_2 < 167$ nm ($D_1$ is less than $D_2$ and $D_2$ is less than 167 nm) is satisfied.

Further features and aspects of the disclosure will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the disclosure and, together with the description, serve to explain the principles of the disclosure.

FIG. 6A is a schematic cross-sectional view illustrating an example of a photoelectric conversion unit according to the fifth exemplary embodiment.

DESCRIPTION OF THE EMBODIMENTS

Figure 1A:
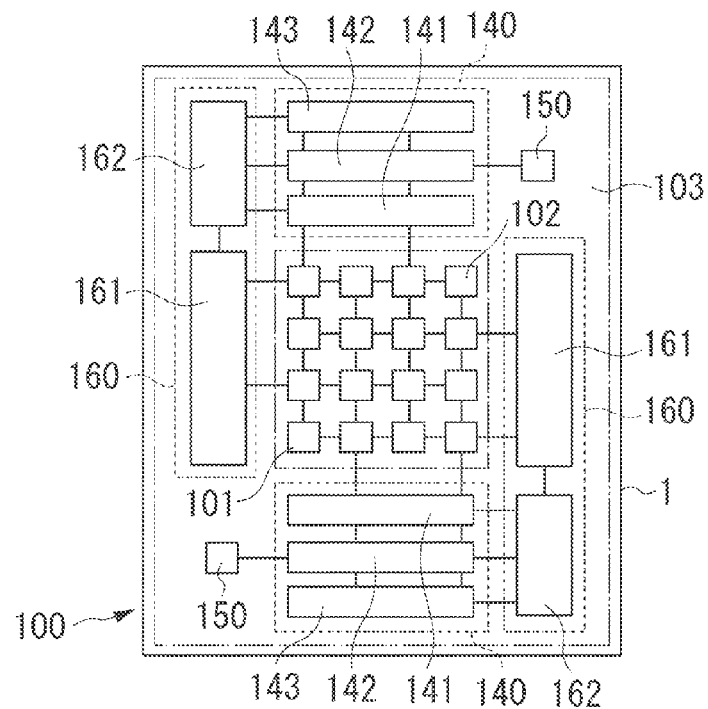
FIG. 1A is a schematic top view for illustrating an example of a photoelectric conversion device.

Various exemplary embodiments, features, and aspects of the disclosure will be described in detail below with reference to the drawings.

In FIG. 7 in U.S. Pat. No. 7,342,269, an insulating layer (29) having a predetermined thickness made of a silicon oxide, and an insulating layer (59) having a predetermined thickness made of a silicon nitride over a diffusion layer (14) as a photoelectric conversion part are provided, thereby reducing a reflection of an incident light entering the diffusion layer 14. The insulating layer (29) and the insulating layer

(59) extend over a polysilicon gate electrode (12) of a transfer gate located in the proximity of the diffusion layer (14).

The polysilicon has a refractive index of substantially the same level as that of silicon which forms the photoelectric conversion part. Therefore, in U.S. Pat. No. 7,342,269, it is presumed that a reflection of an incident light entering the polysilicon gate electrode (12) is also reduced. Thus, there arises such a problem that, when unnecessary light is incident on the gate electrode of the transfer gate, good transfer operation may not be performed, or electrical charge is generated by a transfer channel, and it is considered that performance of the photoelectric conversion device is deteriorated.

In consideration of such a situation, the present exemplary embodiment provides a photoelectric conversion device having a good performance.

The first of the present exemplary embodiment to solve the above-described problems is a photoelectric conversion device including a photoelectric conversion part provided in a semiconductor substrate, a signal generation part configured to generate an electrical signal based on a signal charge generated by the photoelectric conversion part, and a transfer gate configured to the transfer a signal charge to the signal generation part from the photoelectric conversion part. The photoelectric conversion device further includes a continuous film configured to cover the photoelectric conversion part, and to cover a top surface of a gate electrode of the transfer gate.

There is provided a first region configured to have a refractive index lower than refractive indices of the continuous film and the photoelectric conversion part, and to form an interface boundary with the continuous film, between the continuous film and the photoelectric conversion part. There is provided a second region configured to have a refractive index lower than refractive indices of the gate electrode and the continuous film, and to form an interface boundary with the continuous film, between the continuous film and the top surface of the gate electrode. When an optical thickness of the first region is $T_1$, an optical thickness of the second region $T_2$, and a wavelength of an incident light entering the photoelectric conversion part is $\lambda$, formulae of $T_1 < T_2 < \lambda/2 - T_1$ are satisfied.

The second of the present exemplary embodiment to solve the above-described problems is a photoelectric conversion device including a photoelectric conversion part provided in a silicon substrate, a signal generation part configured to generate an electrical signal based on a signal charge generated by the photoelectric conversion part, a transfer gate configured to transfer the signal charge to the signal generation part from the photoelectric conversion part, and a color filter provided on the photoelectric conversion part. The photoelectric conversion device further includes a silicon nitride film configured to cover the photoelectric conversion part, and to cover a top surface of a gate electrode of the transfer gate made of polysilicon.

There is provided a first region composed of at least one of silicon oxide and silicon nitride-oxide, which forms an interface boundary with the silicon nitride film between a portion that covers the photoelectric conversion part of the silicon nitride film and the photoelectric conversion part. There is provided a second region composed of at least one of silicon oxide and silicon nitride-oxide which forms an interface boundary with the silicon nitride film, between the silicon nitride film and the top surface of the gate electrode.

Wave length of light incident on the photoelectric conversion device is between 400 nm or more, and 800 nm or less. When a physical thickness of the first region is $D_1$, and a physical thickness of the second region is $D_2$, then $D_1 \leq 28$ nm, and, $D_1 < D_2 < 167$ nm are satisfied.

According to the present exemplary embodiment, a photoelectric conversion device having a good performance may be provided.

First, an example of a photoelectric conversion device 100 will be described with reference to FIGS. 1A and 1B. For the drawings in FIG. 1 and beyond, the same reference numerals are assigned to common members, and therefore descriptions thereof will not be repeated. In the photoelectric conversion device 100, in FIG. 1A, a photoelectric conversion region 101 surrounded by alternate long and short dashed line is provided, and a plurality of photoelectric conversion units 102 are arrayed in the photoelectric conversion region 101. FIG. 1A illustrates an example of an area sensor in which the plurality of photoelectric conversion units 102 is two-dimensionally arrayed, but a linear sensor in which the plurality of photoelectric conversion units 102 is one-dimensionally arrayed may be used.

Figure 1B:
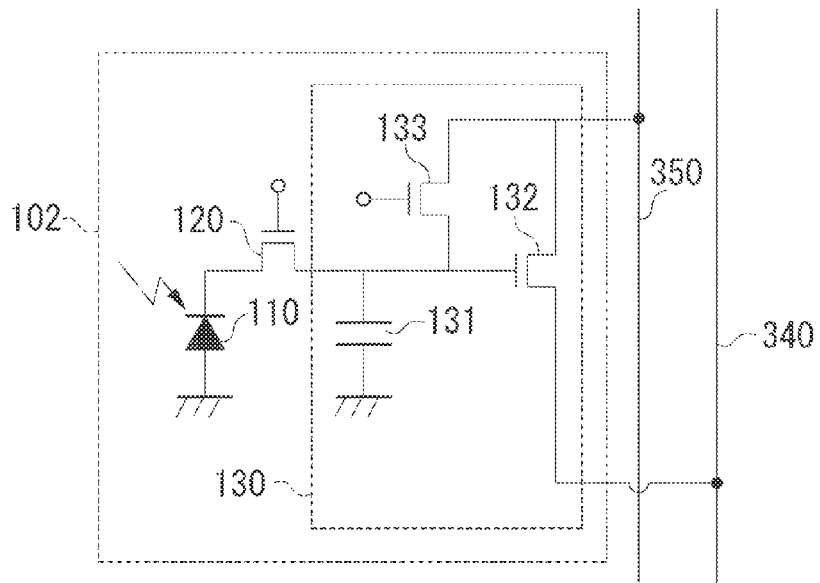
FIG. 1B is a schematic view for illustrating an example of an equivalent circuit of a photoelectric conversion unit.

As illustrated in FIG. 1B, a photoelectric conversion unit 102 includes a photoelectric conversion part 110, a signal generation part 130 that generates an electrical signal based on a signal charge generated by the photoelectric conversion part 110, and a transfer gate 120 that transfers the signal charge to the signal generation part 130 from the photoelectric conversion part 110. The signal generation part 130 in the example includes a capacitor 131, an amplifying transistor 132 having a gate connected to the capacitor 131, and a reset transistor 133 having a source connected to the capacitor 131.

When a beam of light is incident on the photoelectric conversion part 110, a signal charge is generated in the photoelectric conversion part 110. By turning on the transfer gate 120, the signal charge generated in the photoelectric conversion part 110 is transferred to the capacitor 131 of the signal generation part 130, via a transfer channel. Accordingly, the signal charge is held in the capacitor 131. A potential corresponding to an amount of the signal charge held by the capacitor 131 appears on a gate of the amplifying transistor 132.

The amplifying transistor 132 forms a source follower circuit, and an electrical signal generated according to the potential of the gate of the amplifying transistor 132 is output via a signal output line 340. By turning on the reset transistor 133, a potential of the capacitor 131 is reset to a potential supplied via a drive line 350. The signal generation part 130 may also further include a selecting transistor that switches between on and off of an output to the signal output line 340.

The photoelectric conversion unit 102 in the example has one photoelectric conversion part 110 and one signal generation part 130 paired together, but a structure in which a plurality of the photoelectric conversion parts 110 share at least a portion of the signal generation part 130 (for example, the amplifying transistor 132) may be also employed. In that case, the transfer gate 120 may be provided for each of the plurality of photoelectric conversion parts 110.

Figure 2:
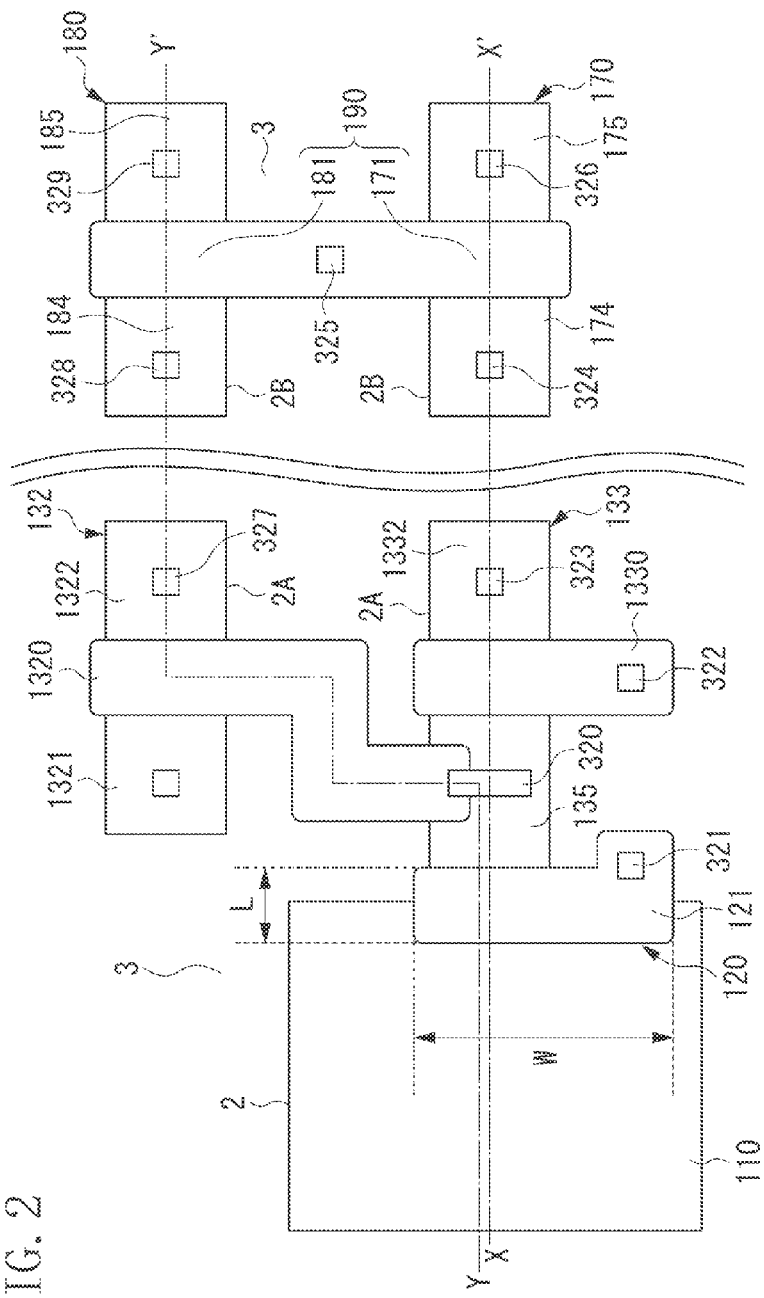
FIG. 2 is a schematic top view for illustrating an example of a photoelectric conversion region and a peripheral circuit region.
Figure 3A:
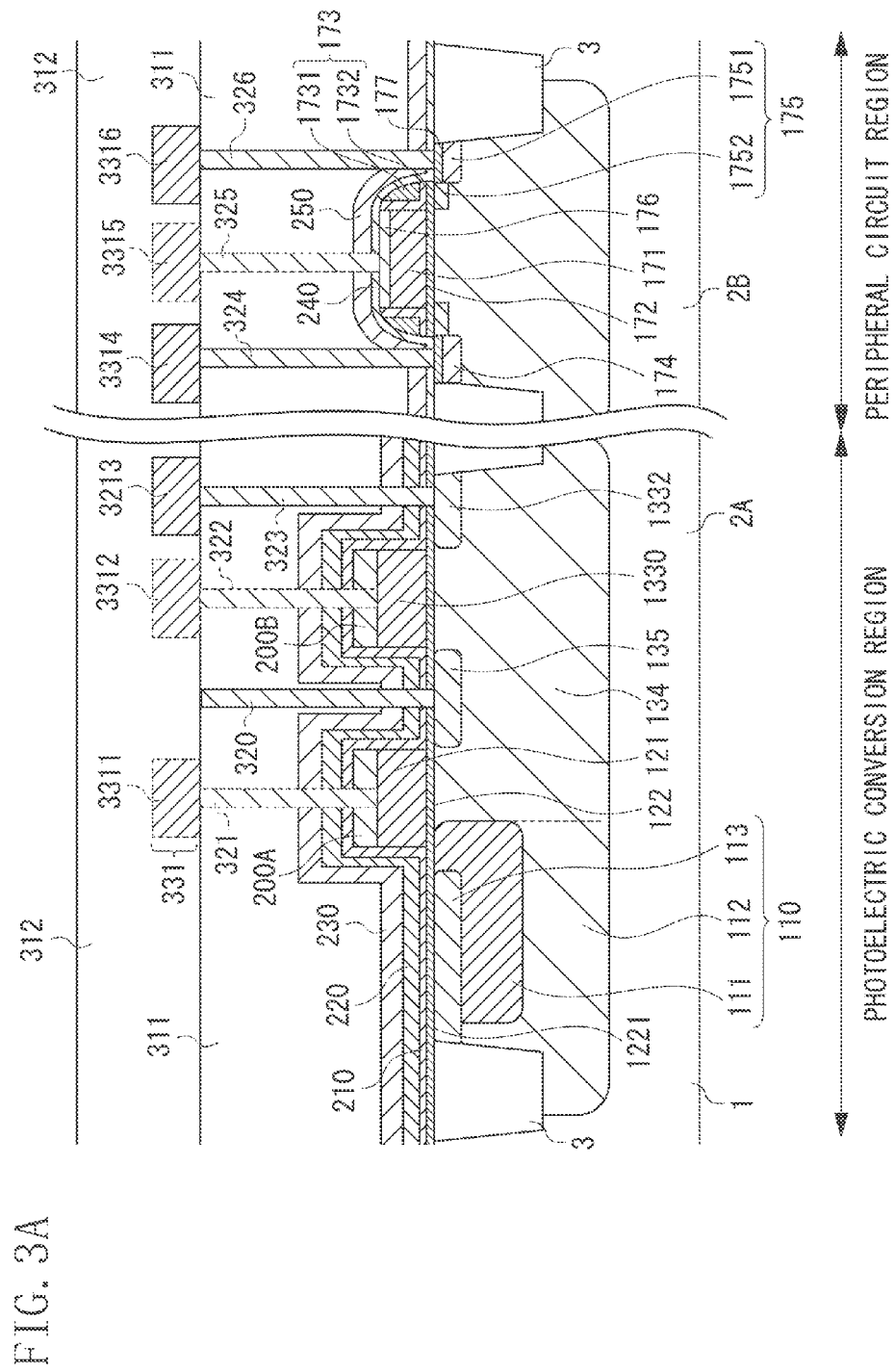
FIG. 3A is a schematic cross-sectional view for illustrating an example of the photoelectric conversion device.
Figure 3B:
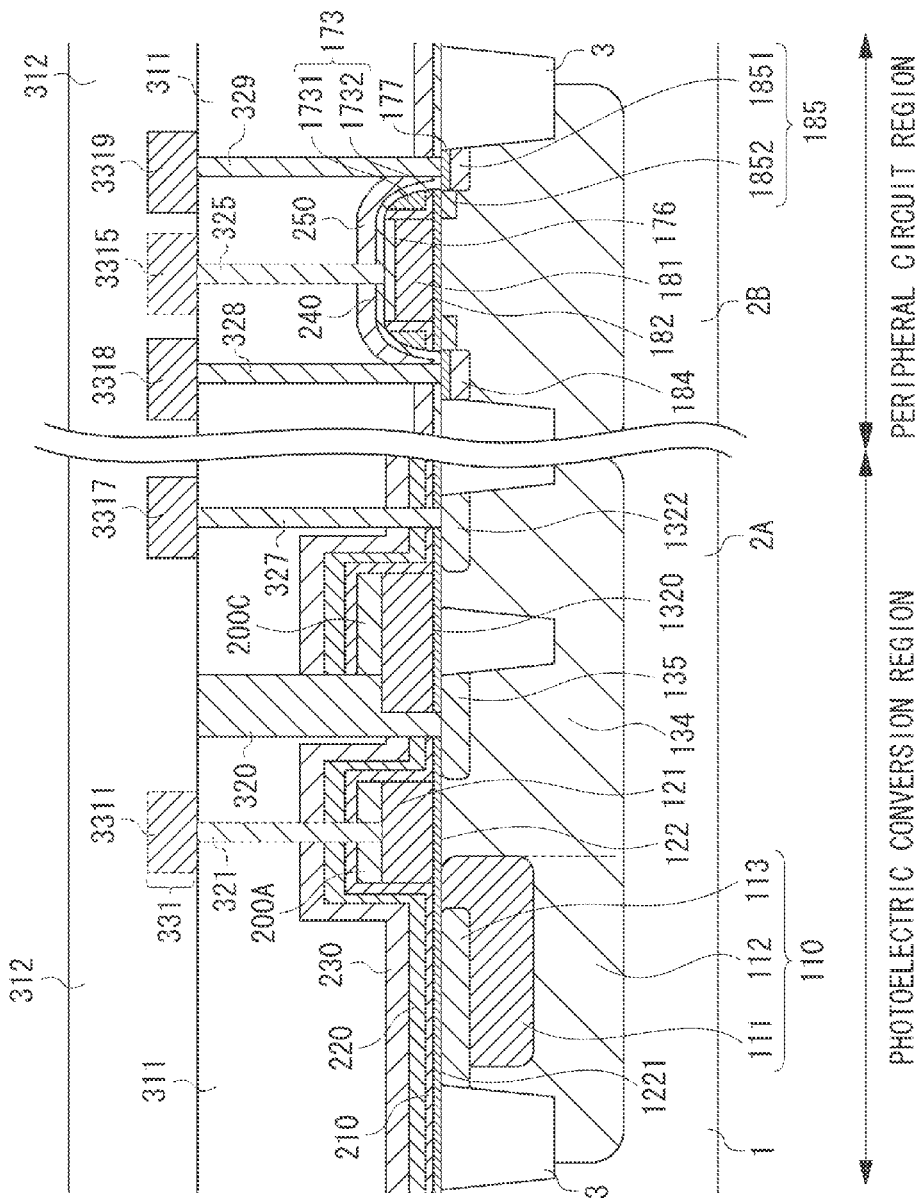
FIG. 3B is schematic cross-sectional view for illustrating an example of the photoelectric conversion device.

FIG. 2 is a schematic top view illustrating an example of the photoelectric conversion device. FIG. 3A is a schematic cross-sectional view taken on a line X-X' of FIG. 2. FIG. 3B is a schematic cross-sectional view taken on a line Y-Y' of FIG. 2.

The photoelectric conversion part 110 is provided in an active section 2 of a semiconductor substrate 1 made of a semiconductor such as single crystal silicon. A part other than the active section 2 is an isolation section 3, and the active section 2 is surrounded by the isolation section 3. The isolation section 3 in the example has a shallow trench isolation (STI) structure, but may have a local oxidation silicon (LOCOS) structure, or may have a diffusion isolation structure. In this example, the photoelectric conversion part 110 and the transfer gate 120, a fifth semiconductor region 135 and the reset transistor 133 are provided in the same active section 2, and the amplifying transistor 132 is provided in a different active section 2. However, the reset transistor 133 may be also provided in a different active section 2 from the photoelectric conversion part 110, and the amplifying transistor 132 and the reset transistor 133 may be also provided in the same active section 2.

The photoelectric conversion part 110 in the example is an embedded type photodiode including a first semiconductor region 111 of a first conductivity type, a second semiconductor region 112 of a second conductivity type, and a third semiconductor region 113 of a second conductivity type. However, the third semiconductor region 113 may be omitted. Further, the photoelectric conversion part 110 may be a photogate.

In the descriptions hereinbelow, the first conductivity type semiconductor region is an impurity region where a majority carrier carries the same electrical charge as the signal charge, and the second conductivity type semiconductor region which is an opposite conductivity type to the first conductivity type is an impurity region where a minority carrier carries the same electrical charge as the signal charge. For example, if the signal charge is an electron, the first conductivity type semiconductor region is an n-type semiconductor region, and the second conductivity-type semiconductor region is a p-type semiconductor region. If the signal charge is positive hole, the first conductivity-type semiconductor region of is a p-type semiconductor region, and the second conductivity-type semiconductor region is an n-type semiconductor region.

Each transistor is a field effect transistor (FET) which has a source and drain, and controls electrical continuity between the source and drain by a gate. The gate has an insulating gate-type structure which is a so-called metal-insulator-semiconductor (MIS) type structure. The MIS type structure has a gate electrode, a gate insulating film, and a channel region which is a semiconductor region located under the gate insulating film. A transistor having the source/drain of the first conductivity-type is defined as a first conductivity type transistor, and a transistor having the source/drain of the second conductivity type is defined as a second conductivity type transistor. For example, if the signal charge is an electron, the first conductivity-type transistor is an n-type transistor, and if the signal charge is a positive hole, the first conductivity type transistor is a p-type transistor. The amplifying transistor 132 and the reset transistor 133 in the example are the first conductivity type transistors.

The first the semiconductor region 111 and the second semiconductor region 112 that constitute the photoelectric conversion part 110 serve as an electrical charge generation region that generates a signal charge. The first semiconductor region 111 and the second semiconductor region 112 form a pn-junction, and the first semiconductor region 111 serves as an accumulation region that accumulates the signal charges. The third semiconductor region 113 is located between the surface of the semiconductor substrate 1 and the first semiconductor region 111. The first semiconductor region 111 and the third semiconductor region 113 form the pn-junction, and the third semiconductor region 113 serves as a surface protection region that suppresses generation of dark currents on the semiconductor substrate 1 surface. A refractive index of the photoelectric conversion part 110 provided on the silicon substrate 1 is typically 3.00 or more and 4.00 or less.

A continuous second conductivity-type semiconductor region including the second semiconductor region 112, and a fourth semiconductor region 134 (described below) are referred to as a well region. Impurity densities of the well region may have a distribution.

The transfer gate 120 a so-called metal-insulator-semiconductor (MIS) type gate having a gate electrode, a gate insulating film, and a channel region which is a semiconductor region located beneath the gate insulating film. Hereinbelow, to differentiate from other transistors, a gate electrode of the transfer gate 120 is referred to as a transfer gate electrode 121, and a gate insulating film of the transfer gate 120 is referred to as a transfer gate insulating film 122.

The channel region is a portion of the well region, and when the transfer gate 120 is turned on, the transfer channel is formed on the channel region. The transfer gate electrode 121 is typically made of polysilicon, but may be made of polysilicon germanium. The typical transfer gate electrode 121 made of polysilicon has a refractive index of 3.00 or more and 4.00 or less. Further, the typical transfer gate insulating film 122 is a single layer film made of the silicon oxide layer, a single layer film made of the silicon nitride-oxide, or a multilayer film having the silicon oxide layer and the silicon nitride-oxide layer.

The transfer gate insulating film 122 in the example is a multilayer film in which the silicon oxide layer and the silicon nitride-oxide layer are disposed in this order from the semiconductor substrate 1 side. A high-k material such as a hafnium oxide may be used for the material of the transfer gate insulating film 122.

The fifth semiconductor region 135 of a first conductivity type forms the pn-junction with a fourth semiconductor region 134 of the second conductivity type, and serves as a floating diffusion region. The fifth semiconductor region 135 forms a portion of the capacitor 131. From this point, it may be said that the fifth semiconductor region 135 which is the floating diffusion region forms a portion of the signal generation part 130.

Figure 4A:
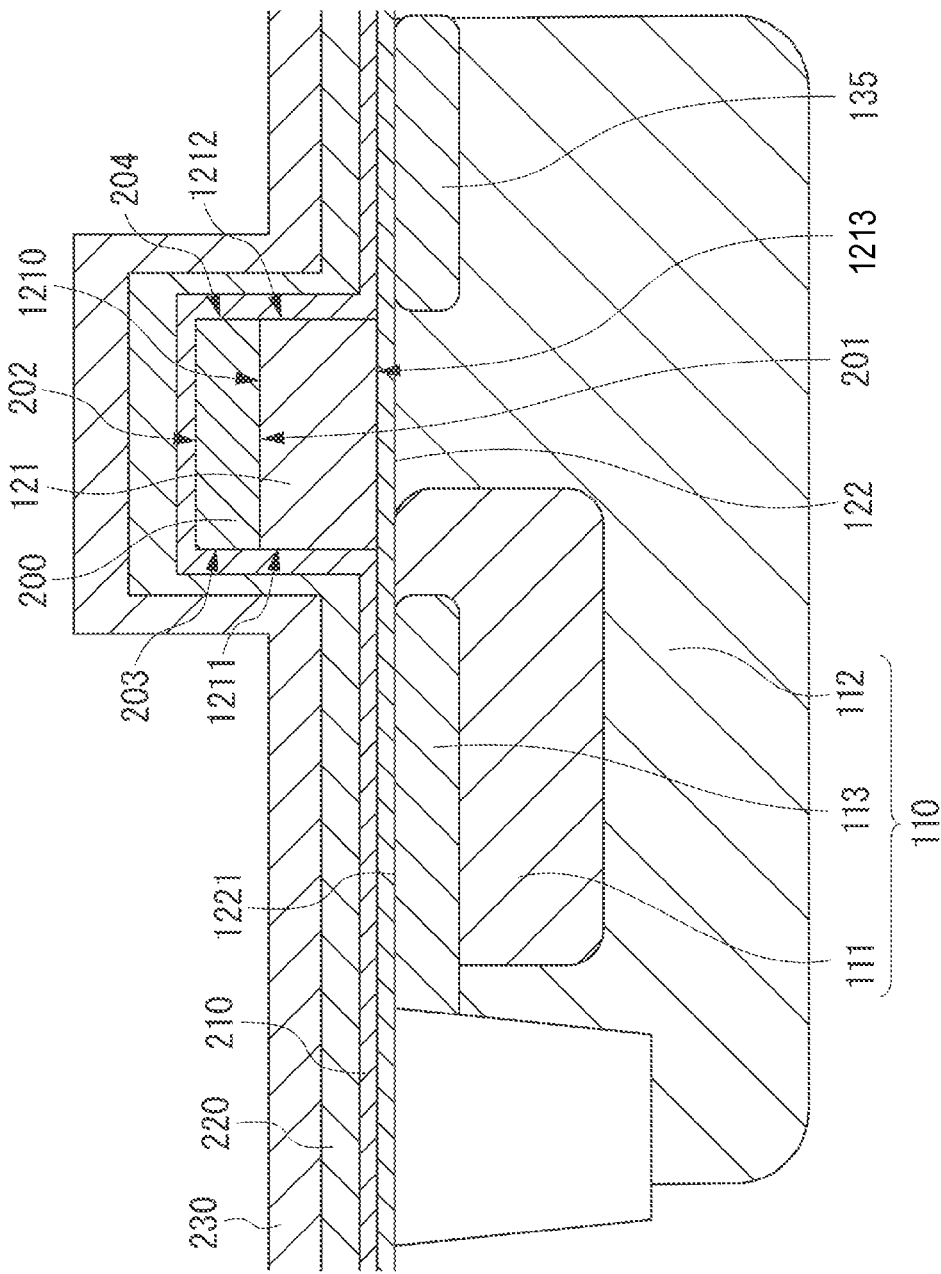
FIGS. 4A and 4B are schematic cross-sectional views for illustrating the enlarged proximity of a transfer gate.
Figure 4B:
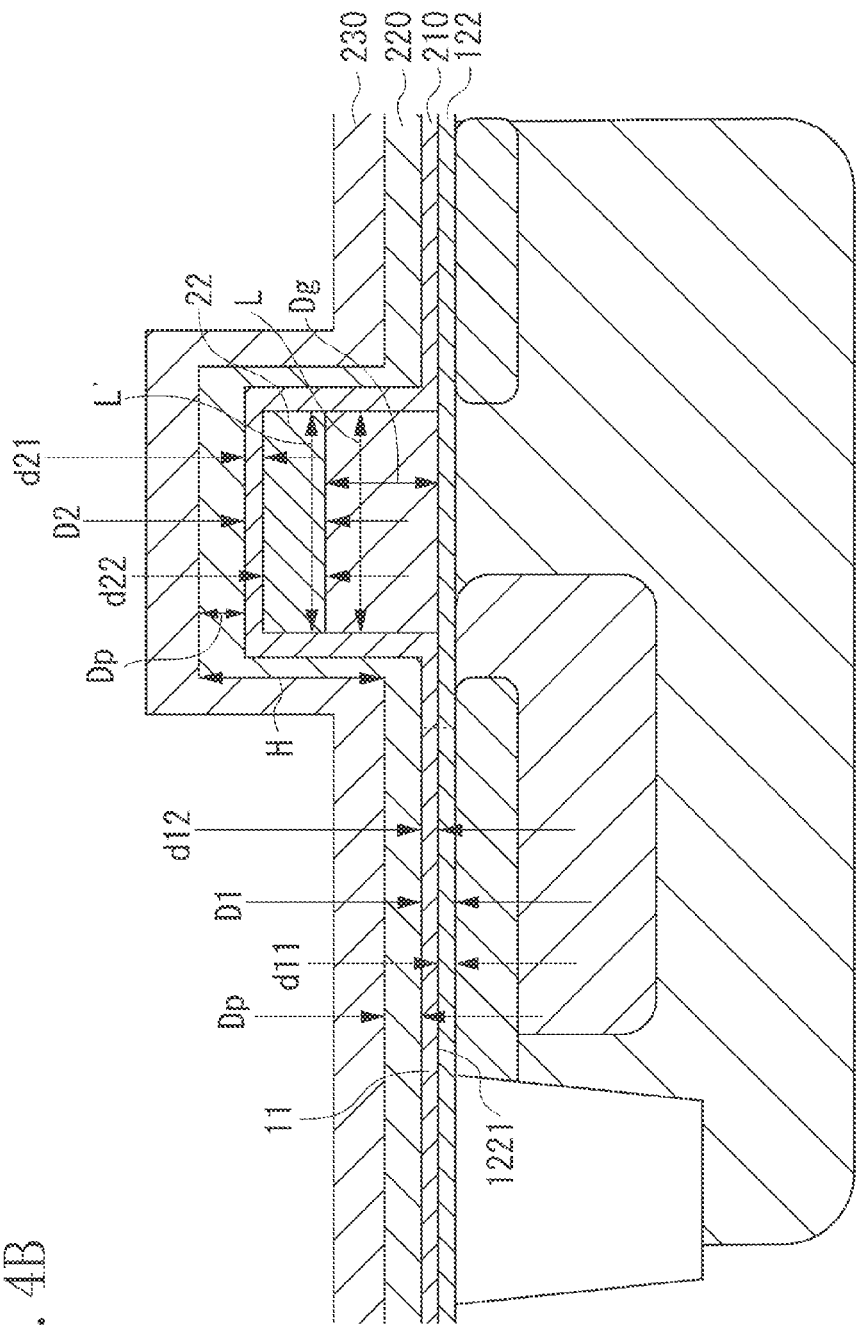

The cross-section of the transfer gate electrode 121 illustrated in FIG. 3A and FIG. 3B nearly has a rectangle shape. The proximity of the transfer gate 120 will be described below, mutually referring to FIG. 4A and FIG. 4B, in addition to FIG. 3A and FIG. 3B. FIG. 4A and FIG. 4B illustrate a same cross-section of the photoelectric conversion device 100, and only in order to avoid the complexity of the drawings, it is divided into FIG. 4A and FIG. 4B.

A bottom surface 1213 of the transfer gate electrode 121 is in contact with the transfer gate insulating film 122, and a top surface 1210 of the transfer gate electrode 121 is an opposite surface to the bottom surface 1213. Of side surfaces of the transfer gate electrode 121, a side surface on the photoelectric conversion part 110 side (the first semiconductor region 111 side) is a first side surface 1211, and a side surface of the signal generation part 130 side (the fifth semiconductor region 135 side) is a second side surface 1212. The first side surface 1211 and the second side surface 1212 each are continuous to a top surface 1210 and the bottom surface 1213 of the transfer gate electrode 121.

In this example, the cross-section of the transfer gate electrode 121 is a rectangle, and an area of the top surface 1210 is equal to an area of the bottom surface 1213. However, the cross-section of the transfer gate electrode 121 may be a trapezoid. In that case, an area of the top surface 1210 of the transfer gate electrode 121 is smaller than the area of the bottom surface 1213, and the first side surface 1211 and the second side surface 1212 form inclined surfaces.

As illustrated in FIG. 3A and FIG. 3B, the photoelectric conversion device 100 is provided with a protection film 220 that covers the photoelectric conversion part 110. The protection film 220 covers the photoelectric conversion part 110, and in addition extends along the side surface of the photoelectric conversion part 110 of the transfer gate electrode 121 of the transfer gate 120, namely, along the first side surface 1211 to cover the top surface 1210 of the transfer gate electrode 121. Therefore, it may be said that the protection film 220 is a continuous film which is at least continuous over the top surface 1210 from over the photoelectric conversion part 110.

The protection film 220 may be a multilayer film. The protection film 220 is desirably a silicon nitride film. The typical silicon nitride has a refractive index of 1.80 or higher. The silicon nitride has a refractive index of 1.80 or higher and lower than 2.50, depending on its film concentration or composition ratio of nitrogen to silicon and impurity concentration.

As illustrated in FIG. 3A and FIG. 3B, the first intermediate film 210 that covers the photoelectric conversion part 110 is provided between the protection film 220 and the photoelectric conversion part 110. The first intermediate film 210 covers the photoelectric conversion part 110, and extends along a side surface of the photoelectric conversion part 110 of the transfer gate electrode 121 of the transfer gate 120, namely, along the first side surface 1211 to cover the top surface 1210 of the transfer gate electrode 121.

The first intermediate film 210 has a refractive index lower than the refractive index of the protection film 220 and the refractive index of the photoelectric conversion part 110. The first intermediate film 210 forms an interface boundary with the protection film 220. The first intermediate film 210 may be a multilayer film. The first intermediate film 210 is desirably composed of at least one of the silicon oxide and the silicon nitride-oxide.

The typical silicon oxide has a refractive index of 1.40 or more. The silicon oxide has a refractive index between 1.40 or more, and 1.80 or less, depending on its film concentration or composition ratio of oxygen and silicon, or impurity concentration. The typical silicon nitride oxide has a refractive index of 1.60 or more. The silicon nitride oxide has a refractive index between 1.60 or more, and 1.80 or less, depending on its film concentration or composition ratio of nitrogen and oxygen and silicon, or impurity concentration.

In practice, the silicon nitride may contain trace amounts of oxygen, and the silicon oxide may contain trace amounts of nitrogen. The silicon nitride-oxide has a ratio of oxygen to nitrogen higher than that of the silicon nitride, and has a ratio of nitrogen to oxygen higher than that of the silicon oxide. For example, in the silicon compound that contains oxygen and nitrogen, if oxygen concentration is between ¼ or more, and 4 or less times high as compared with the nitrogen concentration, there is a high possibility that it is a silicon nitride-oxide.

Further, as illustrated in FIG. 3A and FIG. 3B, between the protection film 220 and the photoelectric conversion part 110, there is provided an extension part 1221 in which the transfer gate insulating film 122 extends from between the transfer gate electrode 121 and the semiconductor substrate 1. In other words, the transfer gate insulating film 122 may be said to cover the photoelectric conversion part 110. The extension part 1221 composed of at least one of the silicon oxide and the silicon nitride-oxide (both in this example) has a refractive index lower than any of the refractive index of the protection film 220 and the refractive index of the photoelectric conversion part 110.

An intermediate member 200A is provided between the first intermediate film 210 and the top surface 1210 of the transfer gate electrode 121. The intermediate member 200A does not extend between the protection film 220 and the photoelectric conversion part 110. In this example, the intermediate member 200A does not also extend between the protection film 220 and the first side surface 1211 of the transfer gate electrode 121, either.

The intermediate member 200A has a refractive index lower than any of the refractive index of the protection film 220 and the refractive index of the photoelectric conversion part 110. The intermediate member 200A may be a laminated member having a multilayer structure. The intermediate member 200A may be desirably composed of at least one of the silicon oxide and the silicon nitride-oxide.

The cross-section of the intermediate member 200A illustrated in FIG. 3A and FIG. 3B nearly has a rectangle shape. In the descriptions hereinbelow, the intermediate member 200A may be described as an intermediate member 200. In this example, a bottom surface 201 of the intermediate member 200A is in contact with the top surface 1210 of the transfer gate electrode 121.

A top surface 202 of the intermediate member 200A is a surface opposite to the bottom surface 201, and is in contact with the first intermediate film 210. Of the side surfaces of the intermediate member 200A, a side surface of the photoelectric conversion part 110 (the first semiconductor region 111 side) is a third side surface 203, and a side surface of the signal generation part 130 (the fifth semiconductor region 135 side) is a fourth side surface 204. The third side surface 203 and the fourth side surface 204 each are connected to the top surface 202 and the bottom surface 201 of the intermediate member 200.

In this example, the cross-section of the intermediate member 200 is a rectangle, and an area of the top surface 202 of the intermediate member 200A is equal to an area of the bottom surface 201. However, the cross-section of the intermediate member 200 may be a trapezoid. In that case, an area of the top surface 202 of the intermediate member 200A is smaller than the area of the bottom surface 201, and the third side surface 203 and the fourth side surface 204 form inclined surfaces.

A first portion between the protection film 220 and the photoelectric conversion part 110, and a second portion between the protection film 220 and the top surface 1210 of the transfer gate electrode 121 will be described in detail with reference to FIG. 4A and FIG. 4B.

In the first portion, a first region 11 is provided which has a refractive index lower than the refractive index of the protection film 220 and the refractive index of the photoelectric conversion part 110, and forms an interface boundary with the protection film 220. In the present exemplary embodiment, the first region 11 is composed of the extension part 1221 of the transfer gate insulating film 122 and the first intermediate film 210.

When a physical thickness of the first region 11 is $D_1$, a physical thickness of the extension part 1221 is $d_{11}$, and a physical thickness of the first intermediate film 210 in the first portion is $d_{12}$, then $D_1 = d_{11} + d_{12}$. The physical thickness is an actual distance between the top surface and bottom surface of the member, the layer or the film, in a vertical direction relative to the foundation of a member, a layer or a film. The physical thickness of the extension part 1221 $d_{11}$ may be the same as, or smaller than a physical thickness of a portion located between the transfer gate electrode 121 and the semiconductor substrate 1, of the transfer gate insulating film 122.

On the other hand, in the second portion, a second region 22 is provided which has a refractive index lower than the refractive index of the protection film 220 and the refractive index of the photoelectric conversion part 110, and forms an interface boundary with the protection film 220. In the present exemplary embodiment, the second region 22 is composed of the intermediate member 200 and the first intermediate film 210.

When a physical thickness of the second region 22 is $D_2$, a physical thickness of the first intermediate film 210 in the second portion is $d_{21}$, and a physical thickness of the intermediate member 200 is $d_{22}$, then $D_2=d_{21}+d_{22}$. A physical thickness of the first region 11 is smaller than a physical thickness of the second region 22, then $D_1<D_2$. In this example structure, when $d_{12}=d_{21}$, $D_1<D_2$ is satisfied if $d_{11}<d_{22}$. The values $d_{12}$ and $d_{21}$ may be different from each other.

The physical thickness $d_{11}$ of the transfer gate insulating film 122 is desirably between 1 nm or more, and 15 nm or less. The physical thicknesses $d_{12}$ and $d_{21}$ of the first intermediate film 210 are between 1 nm or more, and 30 nm or less. The physical thickness $d_{22}$ of the intermediate member 200 falls suitably within a range of 10 nm or more and 100 nm or less.

The first region 11 and the second region 22 having refractive indices lower than the refractive index of the photoelectric conversion part 110, the refractive index of the transfer gate electrode 121, and the refractive index of the protection film 220 are collectively referred to as a low refractive index region. The low refractive index region is a transparent region which has a sufficient transparency with respect to wavelengths of the light which may be incident on the photoelectric conversion part 110 or the transfer gate electrode 121. The low refractive index region is also an insulating region having sufficient insulating properties to prevent the light from interfering with an operation of the photoelectric conversion part 110 or the transfer gate electrode 121.

Not only from an optical viewpoint, but also from an electrical viewpoint, the intermediate member 200 or the first intermediate film 210 is desirably composed of at least one of the silicon oxide and the silicon nitride-oxide.

On the other hand, the photoelectric conversion part 110, the transfer gate electrode 121, and the protection film 220 having refractive indices higher than that of the low refractive index region are collectively referred to as a high refractive index region.

A light is more likely to be attracted toward the high refractive index region than the low refractive index region, and the low refractive index region acts as a wave-optical potential barrier for the light. Accordingly, the light may be prevented from being attracted toward the transfer gate electrode 121, by providing in the second portion a potential barrier (i.e., the second region 22) thicker than a potential barrier (i.e., the first region 11) located in the first portion. As a result, losses of the light going toward the photoelectric conversion part 110 may be suppressed, and the sensitivity of the photoelectric conversion device 100 may be enhanced.

When an optical thickness of the first region 11 is $T_1$, an optical thickness of the extension part 1221 is $t_{11}$, and an optical thickness of the first intermediate film 210 in the first portion is $t_{12}$, then $T_1=t_{11}+t_{12}$. When an optical thickness of the second region 22 is $T_2$, an optical thickness of the first intermediate film 210 in the second portion is $t_{21}$, and an optical thickness of the intermediate member 200 is $t_{22}$, then $T_2=t_{21}+t_{22}$.

Regarding a member, a layer or a film which has a physical thickness of d, and a refractive index of n, its optical thickness t is expressed by a product of n and d ($t=n \times d$). For a region composed of m pieces of elements (members, layers or films) with different refractive indices from each other, an optical thickness T of the region may be expressed by a sum of optical thicknesses $t_k$ of each element, namely, $$T = \sum_{k=1}^{m} t_k = \sum_{k=1}^{m} n_k \times d_k \quad \text{(Equation 1)}$$

Where, $n_k$ is a refractive index of a k-th element, and $d_k$ is a physical thickness of the k-th element.

In the present embodiment, the optical thickness $T_2$ of the second region 22 is greater than the optical thickness $T_1$ of the first region 11. Then, the optical thickness $T_2$ of the second region 22 is smaller than $\lambda/2-T_1$, when a wavelength of light incident on the photoelectric conversion part 110 is $\lambda$. By satisfying these two conditions, namely, by satisfying $T_1<T_2<\lambda/2-T_1$, it becomes possible to prevent the entry of the light into the transfer gate electrode 121 from the top surface 1210 of the transfer gate electrode 121.

The low refractive index region sandwiched between two high refractive index regions, in comparison with a case where the low refractive index region is not present, has the effect of lowering a transmissivity of the light from one high refractive index region to the other high refractive index region.

The transmissivity correlates with the optical thickness of the low refractive index region and a wavelength of the light. The correlation is based on an interference action, between a reflected light at an interface boundary between the high refractive index region and the low refractive index region on one side, and a reflected light at an interface boundary between the high refractive index region and the low refractive index region on the other side.

By satisfying the above-described $T_1<T_2<\lambda/2-T_1$, the transmissivity of the light from the protection film 220 to the transfer gate electrode 121 may be made lower than the transmissivity of the light from the protection film 220 to the photoelectric conversion part 110.

Typically, the photoelectric conversion part 110 is made of the silicon, and the transfer gate electrode 121 is made of polysilicon. At this time, the protection film 220 is made of the silicon nitride, and the first region 11 and the second region 22 are suitably composed of at least one of the silicon oxide and the silicon nitride-oxide, as described above. In that case, the physical thickness $D_2$ of the second region 22 is greater than the physical thickness of the first region 11. Suitably, the physical thickness $D_1$ of the first region 11 is set to 28 nm or less, and the physical thickness $D_2$ of the second region 22 is set to greater than 28 nm and smaller than 83 nm. It becomes possible to prevent the entry of the light into the transfer gate electrode 121 by satisfying the conditions.

In the present exemplary embodiment, since the bottom surface 201 of the intermediate member 200 is in contact with the top surface 1210 of the transfer gate electrode 121, the second region 22 is configured to form an interface boundary with the transfer gate electrode 121. As a result, the entire second portion from the protection film 220 to the top surface 1210 of the transfer gate electrode 121 is occupied by the second region 22 having a refractive index lower than the refractive index of the transfer gate electrode 121 and the refractive index of the protection film 220.

In a case where a high refractive index region is provided, which has a refractive index equal to or greater than the refractive index of the protection film 220, and a refractive index between the refractive index of the second region 22 and the refractive index of the transfer gate electrode 121 between the second region 22 and the top surface 1210 of the transfer gate electrode 121, the second region 22 does not contact (abut) the top surface 1210 of the transfer gate electrode 121.

In comparison with this case, if the second region 22 forms an interface boundary with the transfer gate electrode 121, it is more likely to prevent the entry of the light into the transfer gate electrode 121 from the top surface 1210 of the transfer gate electrode 121.

In the present exemplary embodiment, when a length of the top surface 1210 of the transfer gate electrode 121 in a transfer direction of the transfer gate 120 is L, and a length of the bottom surface 201 of the intermediate member 200 in the transfer direction of the transfer gate 120 is L', L and L' are equal to each other. Further, in the present exemplary embodiment, when a width of the top surface 1210 of the transfer gate electrode 121, in a direction vertical to the transfer direction of the transfer gate 120 is W, and a width of the bottom surface 201 of the intermediate member 200 in the transfer direction of the transfer gate 120 is W', W and W' are equal to each other.

In FIG. 2, only the length L and the width W are written for convenience. In this way, it is desirable that the intermediate member 200 covers substantially the entire surface of the top surface 1210 of the transfer gate electrode 121. By doing so, the entry of the light into the transfer gate electrode 121 may be more reduced. In FIG. 4B, arrows indicating the lengths L and L' are displayed apart from each other, for a descriptive purpose.

In the present exemplary embodiment, a physical thickness $d_{22}$ of the intermediate member 200 is smaller than the length L' of the bottom surface 201 of the intermediate member 200. Further, the physical thickness $d_{22}$ of the intermediate member 200 is smaller than a physical thickness $D_g$ of the transfer gate electrode 121. Further, a physical thickness $d_{21}$ of the first intermediate film 210 is smaller than the physical thickness $d_{22}$ of the intermediate member 200.

A physical thickness $D_2$ of the second region 22 is smaller than the physical thickness $D_g$ of the transfer gate electrode 121. The physical thickness $D_2$ of the second region 22 should be made as small as possible. In particular, it is more desirable that the physical thickness $D_2$ of the second region 22 is ½ or less of the physical thickness $D_g$ of the transfer gate electrode 121. Further, the physical thickness $d_{22}$ of the intermediate member 200 is also desirably ½ or less of the physical thickness $D_g$ of the transfer gate electrode 121, and the physical thickness $d_{21}$ of the first intermediate film 210 should also be ½ or less of the physical thickness $d_{22}$ of the intermediate member 200.

The larger the total of the physical thickness $D_1$ of the second region 22 and the physical thickness $D_g$ of the transfer gate electrode 121, the longer a length H of a portion 30 of the protection film 220 along the optical path to the photoelectric conversion part 110. A portion of the protection film 220 along the optical path to the photoelectric conversion part 110 attracts the light from the optical path, but losses of an incident light entering the photoelectric conversion part 110 may be smaller, by making the physical thickness $D_2$ of the second region 22 smaller.

The present embodiment is effective when the physical thickness $D_p$ of the protection film 220 is smaller than the physical thickness $D_g$ of the transfer gate electrode 121. This is because, when the protection film 220 becomes extremely thick, a shape of the top surface 1210 of the protection film 220 may hardly reflect a shape of the first side surface 1211 or the top surface 1210 of the transfer gate electrode 121, and an influence on a light in the proximity of the photoelectric conversion part 110 caused by the transfer gate electrode 121 is reduced.

The physical thickness $D_g$ of the transfer gate electrode 121 may be set as appropriate according to transfer characteristics of the transfer gate 120, and typically, it is set to 50 nm or more, and 500 nm or less. When the physical thickness $D_p$ of the protection film 220 extremely large, stresses exerted on the semiconductor substrate 1 become large. Typically, the physical thickness $D_p$ of the protection film 220 is set to 10 nm or more, and 100 nm or less.

Further, the physical thickness $D_p$ and the optical thickness $T_p$ of the protection film 220 may be set as appropriate according to a wavelength of the incident light, so that an interference of the light directed toward the photoelectric conversion part 110 is suppressed by reflections at the top and bottom surface 201 of the protection film 220. In FIG. 4, the both of physical thicknesses of a portion which covers the photoelectric conversion part 110 and a portion which covers the top surface 1210 of the transfer gate electrode 121, of the protection film 220, are denoted as $D_p$, but the both physical thicknesses may be different from each other.

In the present exemplary embodiment, it is configured such that the extension part 1221 of the transfer gate insulating film 122 having a refractive index lower than refractive indices of the protection film 220 and the photoelectric conversion part 110 is included in the first portion and forms the first region 11, and the first region 11 forms an interface boundary with the photoelectric conversion part 110. As a result, all the first portion from the protection film 220 to the photoelectric conversion part 110 is occupied by the first region 11 having a refractive index equal to or smaller than the refractive indices of the photoelectric conversion part 110 and the protection film 220.

With such a configuration, an incident light may sufficiently enter the photoelectric conversion part 110. However, for example, in a case where by using a high-k material for the transfer gate insulating film 122, the refractive index of the transfer gate insulating film 122 is higher than the refractive index of the protection film 220, the extension part 1221 does not form the first region 11, and the first region 11 does not contact the photoelectric conversion part 110. However, it is desirable to provide between the first region 11 and the photoelectric conversion part 110, a high refractive index region having a refractive index equal to or greater than the refractive index of the protection film 220, and having a refractive index between the refractive indices of the first region 11 and the photoelectric conversion part 110 in improving the incidence of the light on the photoelectric conversion part 110.

A configuration of other portions in the photoelectric conversion device 100 will be described in detail. As illustrated in FIG. 3A and FIG. 3B, a second protection film 230 that covers the photoelectric conversion part 110 and the protection film 220 is provided. As a result, the protection film 220 is located between the second protection film 230 and the photoelectric conversion part 110. The second protection film 230 covers the photoelectric conversion part 110, and extends along a side surface of the photoelectric conversion part 110 side of the transfer gate electrode 121 of the transfer gate 120, namely, the first side surface 1211, to cover the top surface 1210 of the transfer gate electrode 121.

The second protection film 230 preferably has a refractive index lower than the refractive indices of the protection film 220 and the photoelectric conversion part 110. The second protection film 230 forms an interface boundary with the protection film 220. The second protection film 230 may be composed of at least one of the silicon oxide and the silicon nitride-oxide, and may be more desirably made of the silicon oxide.

Over the second protection film, an insulating film 310 having a plurality of inter-layer insulating layers is provided. In FIG. 3A and FIG. 3B, a first interlayer insulating layer 311 and a second interlayer insulating layer 312, within the insulating film 310 are illustrated. A bottom surface of the first interlayer insulating layer 311 is in contact with the second protection film 230, and a top surface of the first interlayer insulating layer 311 is flat. On the other hand, a bottom surface of the second interlayer insulating layer 312 is in contact with the flat top surface of the first interlayer insulating layer 311, and a top surface of the second interlayer insulating layer 312 is also flat. As a result, the second interlayer insulating layer 312 is not disposed along the transfer gate electrode 121, and is not shaped to reflect a shape of the transfer gate electrode 121.

As illustrated in FIG. 3A, over a gate electrode 1330 of the reset transistor 133, the intermediate member 200 and the first intermediate film 210 are also provided, similar to the transfer gate electrode 121 of the transfer gate 120. The intermediate member 200 over the gate electrode 1330 of the reset transistor 133 is provided discontinuously with the intermediate member 200 over the transfer gate electrode 121 of the transfer gate 120. On the other hand, the first intermediate film 210 extends, from over the transfer gate electrode 121 of the transfer gate 120, along a second side surface 1212 of the transfer gate electrode 121 of the transfer gate 120, the fifth semiconductor region 135, and along a side surface of the fifth semiconductor region 135 side of the gate electrode 1330 of the reset transistor 133, and over the gate electrode 1330 of the reset transistor 133.

Similar to the first intermediate film 210, the protection film 220 also extends from over the transfer gate electrode 121 of the transfer gate 120, along a second side surface 1212 of the transfer gate electrode 121 of the transfer gate 120, the fifth semiconductor region 135, and a side surface on the fifth semiconductor region 135 side of the gate electrode 1330 of the reset transistor 133, and over the gate electrode 1330 of the reset transistor 133. The amplifying transistor 132 is also similarly configured, and though not illustrated, the intermediate member 200 and the first intermediate film 210 are provided also over the gate electrode 1320 of the amplifying transistor 132.

A first contact plug 321 is connected to the transfer gate electrode 121 of the transfer gate 120. In FIG. 3A, for reference, the first contact plug 321 and a second contact plug 322, which are not present on an X-X' line in FIG. 2, are indicated with dotted lines. The first contact plug 321 may be also provided on the active section 2 such as on the channel region. However, as illustrated in FIG. 2, by extending the transfer gate electrode 121 from above the active section 2 onto the isolation section 3, the first contact plug 321 may be preferably arranged on the isolation section 3. Similarly, the second contact plug 322 is connected to the gate electrode 1330 of the reset transistor 133. The second contact plug 322 may be also preferably arranged on the isolation section 3.

The gate electrode 1320 of the amplifying transistor 132 extends toward the fifth semiconductor region 135 (floating diffusion region), and both of the fifth semiconductor region 135 (floating diffusion region) and the gate electrode 1320 of the amplifying transistor 132 are connected to each other by a shared contact 320. By using the contact plugs and wiring layer, in place of the shared contact 320, the fifth semiconductor region 135 and the gate electrode 1320 of the amplifying transistor 132 may be also connected to each other. A third contact plug 323 is connected to a drain 1332 of the reset transistor 133. As illustrated in FIG. 3B, the contact plugs each are connected to a source 1321 and a drain 1322 of the amplifying transistor. A seventh contact plug 327 is connected to the drain 1322 of the amplifying transistor 132.

On the first interlayer insulating layer 311, a first wiring layer 331 including a first wiring 3311, a second wiring 3312, and a third wiring 3313 is provided. The first through third wirings each are connected to the first through third contact plugs. The contact plugs in the example are made of tungsten, and the wirings are made of aluminum, but they are not limited thereto. A seventh wiring 3317 of the first wiring layer 331 is connected to a seventh contact plug 327.

As illustrated in FIG. 1A, the photoelectric conversion device 100 according to the present exemplary embodiment may be provided with a signal processing unit 140 that processes an electrical signal generated by the signal generation part 130. Further, the photoelectric conversion device 100 may be provided with an output unit 150 for externally outputting the signal processed by the signal processing unit 140, and a control unit 160 for controlling the photoelectric conversion region 101 and the signal processing unit 140, in addition to the signal processing unit 140. In this example, the signal processing unit 140, the output unit 150, and the control unit 160 are provided in the peripheral circuit region 103 located around the photoelectric conversion region 101, but at least a portion of the signal processing unit 140 may be also provided in the photoelectric conversion region 101.

In FIG. 1A, a region between alternate long and short dash line and alternate long and two short dashes line is a peripheral circuit region 103. In this example, the signal processing unit 140 includes an amplifying circuit 141 having a plurality of column amplifiers, a conversion circuit 142 having a plurality of column AD converters, and a horizontal scanning circuit 143 for selecting an output from the conversion circuit 142 and outputting to the output unit 150. The output unit 150 has an electrode pad or a protection circuit, and the control unit 160 has a horizontal scanning circuit 143 and a timing generation circuit 162. The configuration of the peripheral circuit region 103 may be designed as appropriate.

The signal processing unit 140 is composed of many transistors, but typically, the transistors of the signal processing unit 140 have a different structure from the transistors (the amplifying transistor 132 or the reset transistor 133) of the signal generation part 130.

FIG. 2 illustrates an example of a transistor (hereinafter, referred to as a peripheral transistor) of the signal processing unit 140 provided in the peripheral circuit region 103. The typical signal processing unit 140 is composed of, as illustrated in FIG. 2, a first conductivity type peripheral transistor 170, and a second conductivity type peripheral transistor 180. Typically, a same conductivity type peripheral transistor as a transistor of the signal generation part 13 and opposite conductivity type peripheral transistor to a transistor of the signal generation part 130 have different structure from the transistors of the signal generation part 130.

FIG. 3A illustrates the first conductivity type peripheral transistor 170. The second conductivity type peripheral transistor 180 has similar structure, except that conductivity type is opposite. The transfer gate electrode 121 is preferably made of a first conductivity type polysilicon, and a gate electrode (hereinafter, referred to as a first peripheral gate electrode 171) of the first conductivity type peripheral transistor 170 is preferably made of the first conductivity type polysilicon. A gate electrode of the second conductivity type peripheral transistor 180 (hereinafter, referred to as a second peripheral gate electrode 181) is preferably made of the second conductivity type polysilicon.

A first conductivity type impurity concentration of the first peripheral gate electrode 171 is preferably higher than a first conductivity-type impurity concentration of the transfer gate electrode 121. A physical thickness of the gate insulating film 172 of the first conductivity type peripheral transistor 170 is preferably thinner than a physical thickness of the transfer gate insulating film 122 of the transfer gate 120.

A portion of a drain 175 of the first conductivity type peripheral transistor 170 is covered with a silicide layer 177. A source 174 of the first conductivity type peripheral transistor 170 is also covered with a silicide layer. Further, a top surface of the first peripheral gate electrode 171 of the peripheral transistor is covered with a silicide layer 176. At least one of the silicide layer 177 which covers the source and drain and the silicide layer 176 which covers the top surface 1210 of the gate electrode 121 may be omitted.

Further, a peripheral gate insulating film 172 does not extend at least between the drain 175 and the silicide layer 177, and the silicide layer 177 and the drain 175 are in contact with each other. The same also applies to the source 174. As illustrated in FIG. 3B, a source 184, and a drain 185 of the second conductivity-type peripheral transistor 180, and the second peripheral gate electrode 181 are similarly configured.

In this example, as illustrated in FIG. 3A, the first peripheral gate electrode 171 and the second peripheral gate electrode 172 are integrally formed. An integrally formed peripheral gate electrode 190 has the first conductivity type portion (the first peripheral gate electrode 171) and the second conductivity type portion (the second peripheral gate electrode 181). Furthermore, in the peripheral gate electrode 190, the first conductivity type portion and the second conductivity type portion may form pn-junction.

By covering the first conductivity type portion and the second conductivity type portion of the integral peripheral gate electrode 190 with the silicide layer 176, the first conductivity type portion and the second conductivity-type portion are shunted by the silicide layer 176, and an operation of the peripheral transistors may be prevented from becoming unstable due to the pn-junction.

Further, the peripheral transistor has the side wall spacers 173 which are in contact with the side surfaces of the first peripheral gate electrode 171. In this example, the side wall spacers 173 have two-layer structure having a first dielectric layer 1731, and a second dielectric layer 1732 located between the first dielectric layer 1731 and the first peripheral gate electrode 171 and between the first dielectric layer 1731 and the semiconductor substrate 1.

A dielectric constant of the second dielectric layer 1732 is preferably lower than a dielectric constant of the first dielectric layer 1731, however, a reverse configuration may also be used. For example, the first dielectric layer 1731 is made of silicon oxide, and the second dielectric layer 1732 is made of silicon nitride. In this example, the gate insulating film 172 extends from between the semiconductor substrate 1 and the first peripheral gate electrode 171, to between the semiconductor substrate 1 and the side wall spacers 173. However, the gate insulating film 172 may also be provided only between the semiconductor substrate 1 and the first peripheral gate electrode 171, and the spacers 173 are in contact with the semiconductor substrate 1.

Beneath the side wall spacers 173, a low concentration portion 1752 of the drain 175 is located. The low concentration portion 1752 has a lower impurity concentration in comparison with another portion of the drain 175 (a high concentration portion 1751), and has what is called a lightly doped drain (LDD) structure. The side wall spacers 173 and the low concentration portion 1752 of the drain 175 may be also omitted. The source 174 may similarly have a low concentration portion and a high concentration portion. Regarding also the peripheral transistor 180, the drain 185 may similarly have a high concentration portion 1851 and a low concentration portion 1852.

The peripheral transistor is covered with a second intermediate film 240 which is different from the first intermediate film 210 which covers the transfer gate electrode 121. More specifically, the second intermediate film 240 covers the source 174 and drain 175 of the peripheral transistor 170, and covers the first peripheral gate electrode 171, along the side surface of the first peripheral gate electrode 171. In this example, the silicide layer 177 is located between the second intermediate film 240 and the drain 175 and between the second intermediate film 240 and a top surface of the first peripheral gate electrode 171.

Further, in this example, the side wall spacer 173 is located between the second intermediate film 240 and the side surface of the first peripheral gate electrode 171. The second intermediate film 240 is preferably made of silicon oxide. The same also applies to the second conductivity-type peripheral transistor 180.

The peripheral transistor is covered with a third protection film 250 which is different from the protection film 220, and the second protection film 230 which covers the transfer gate electrode 121. More specifically, the third protection film 250 covers the drain 174 of the peripheral transistor 170, and covers the top surface of the first peripheral gate electrode 171, along the side surface of the first peripheral gate electrode 171. In this example, the silicide layer 176 is located between the third protection film 250 and the drain 175 and between the third protection film 250 and the top surface of the first peripheral gate electrode 171.

Further, in this example, the side wall spacer 173 is located between the third protection film 250 and the top surface of the first peripheral gate electrode 171. The third protection film 250 is preferably made of the silicon nitride. As described above, the second intermediate film 220 is provided between the third protection film 250 and the semiconductor substrate 1 and between the third protection film 250 and the first peripheral gate electrode 171. The third protection film 250 is preferably thicker than the second intermediate film 240.

The first interlayer insulating layer 311 and the second interlayer insulating layer 312 of the insulating film 310 extend from the photoelectric conversion region 101 to the peripheral circuit region 103 to cover the semiconductor substrate 1. In this example, the second intermediate film 240 and the third protection film 250 are located between the insulating film 310 of the peripheral circuit region 103 and the semiconductor substrate 1 and between the peripheral gate electrode 171 and the semiconductor substrate 1, but at least one of the second intermediate film 240 and the third protection film 250 may be omitted.

As illustrated in FIG. 3A, a fourth contact plug 324 and a sixth contact plug 326 each are connected to the source 174 and drain 175 of the peripheral transistor 170, via the silicide layer 177. Similarly, a fifth contact plug 325 is connected to the first peripheral gate electrode 171 of the peripheral transistor 170, via the silicide layer 176. The fourth contact plug 324, the fifth contact plug 325, and the sixth contact plug 326 each are in contact with the third protection film 250 and the second intermediate film 240, and penetrate the third protection film 250 and the second intermediate film 240.

Similarly, as illustrated in FIG. 3B, an eighth contact plug 328 and a ninth contact plug 329 each are connected to the source 184 and drain 185 of the peripheral transistor 180, via the silicide layer 177. Similarly, the fifth contact plug 325 is connected to the second peripheral gate electrode 181 of the peripheral transistor 180 via the silicide layer 176.

A high-speed drive of the peripheral transistor 170 may be achieved by reducing a connection resistance between the first peripheral gate electrode 171 and the fifth contact plug 325. The resistance between the first peripheral gate electrode 171 and the fifth contact plug 325 may be made small by providing the silicide layer 176. The silicide layer 177 is provided, so that a high-speed drive of the peripheral transistor may be achieved by reducing a connection resistance between the drain 175 and the sixth contact plug 326. The same also applies to the source 174 and the fourth contact plug 324, and also applies to the second conductivity-type peripheral transistor 180. On the other hand, since the silicide layer is not provided at least on the transfer gate electrode 121 in the photoelectric conversion region 101, noise due to metal contamination may be suppressed.

Figure 5A:
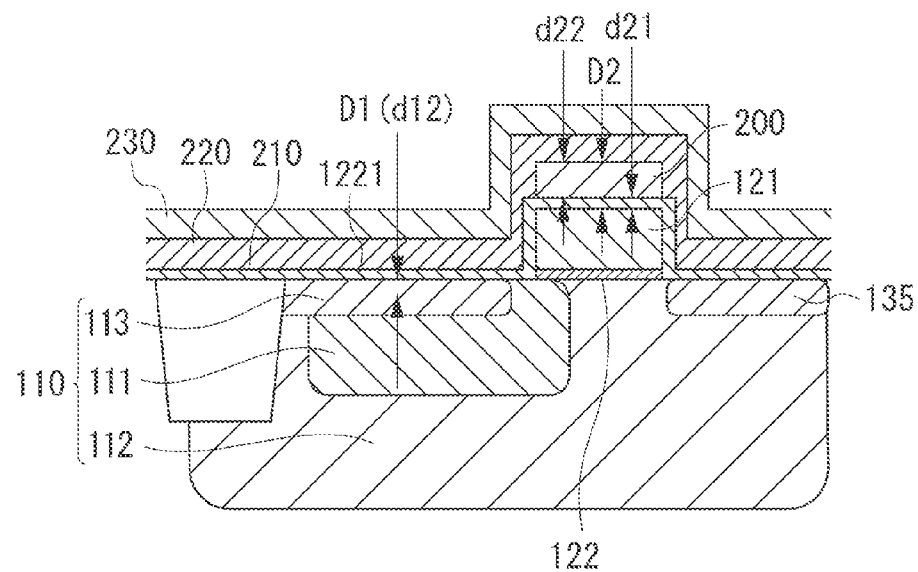
FIG. 5A is a schematic cross-sectional view for illustrating the proximity of a transfer gate according to a second exemplary embodiment.

An example of a second exemplary embodiment of the photoelectric conversion device 100 will be described with reference to FIG. 5A. In the present exemplary embodiment, the configuration of the transfer gate insulating film 122 is different from the first exemplary embodiment. In the first exemplary embodiment, the transfer gate insulating film 122 has the extension part 1221 which covers the photoelectric conversion part 110. On the other hand, in the present exemplary embodiment, the transfer gate insulating film 122 does not cover the photoelectric conversion part 110, and the first intermediate film 210 is in contact with the photoelectric conversion part 110. As a result, the first region 11 is composed of the first intermediate film 210 located in the first portion, and the physical thickness $D_1$ of the first region 11 coincides with the physical thickness $d_{12}$ of the first intermediate film 210.

Further, in the present exemplary embodiment, positions of the intermediate member 200 and the first intermediate film 210 are different from the first exemplary embodiment. In the first exemplary embodiment, the first intermediate film 210 extends between the intermediate member 200 and the protection film 220 to cover the top surface 1210 of the transfer gate electrode 121. On the other hand, in the present exemplary embodiment, the first intermediate film 210 extends between the intermediate member 200 and the transfer gate electrode 121 to cover the top surface 1210 of the transfer gate electrode 121.

The physical thickness $D_2$ of the second region 22 is expressed by a sum of the physical thickness $d_{21}$ of the first intermediate film 210 and the physical thickness $d_{22}$ of the intermediate member 200 the same as the first exemplary embodiment. In the above, there are two different points between the present and second exemplary embodiments, but only one point may be different from the first exemplary embodiment.

An example of a third exemplary embodiment of the photoelectric conversion device 100 will be described with reference to FIG. 5B. The present exemplary embodiment differs from the first exemplary embodiment in that the first intermediate film 210 is not provided. The protection film 220 forms an interface boundary with the extension part 1221 of the transfer gate insulating film 122. As a result, the first region 11 is composed of the extension part 1221 of the transfer gate insulating film 122, and the physical thickness $D_1$ of the first region 11 coincides with the physical thickness $d_{11}$ of the extension part 1221. Further, the protection film 220 forms an interface boundary with the intermediate member 200. As a result, the second region 22 is composed of the intermediate member 200, and the physical thickness $D_2$ of the second region 22 coincides with the physical thickness $d_{22}$ of the intermediate member 200.

An example of a fourth exemplary embodiment of the photoelectric conversion device 100 will be described with reference to FIG. 5C. The present exemplary embodiment differs from the first exemplary embodiment, in that the intermediate member 200 is not provided. The first intermediate film 210 located in the first portion is thinner than the first intermediate film 210 located in the second portion. As a result, the second region 22 is composed of the first intermediate film 210, and a physical thickness 2 of the second region 22 coincides with the physical thickness $d_{21}$ of the portion located in the second portion of the first intermediate film 210.

An example of a fifth exemplary embodiment of the photoelectric conversion device 100 will be described with reference to FIG. 5D. In the present exemplary embodiment, the configuration of the first intermediate film 210 is different from the second exemplary embodiment. In the second exemplary embodiment, the first intermediate film 210 extends between the protection film 220 and the intermediate member 200 to cover the top surface 1210 of the transfer gate electrode 121. On the other hand, in the present exemplary embodiment, the first intermediate film 210 does not cover the top surface 1210 of the transfer gate electrode 121, and does not extend between the protection film 220 and the transfer gate electrode 121. The physical thickness $D_2$ of the second region 22 coincides with the intermediate member 200 the physical thickness $d_{22}$.

An example of a sixth exemplary embodiment of the photoelectric conversion device 100 will be described with reference to FIG. 6A. The present exemplary embodiment differs from the first exemplary embodiment in that the protection film 220 does not cover the second side surface 1212 of the transfer gate electrode 121. Further, the present exemplary embodiment differs in that the first intermediate film 210 does not cover the second side surface 1212 of the transfer gate electrode 121. On the other hand, the third protection film 250 is provided over the second protection film 230, extending from the peripheral circuit region, and covers the top surface 1210 of the transfer gate electrode 121.

Figure 6B:
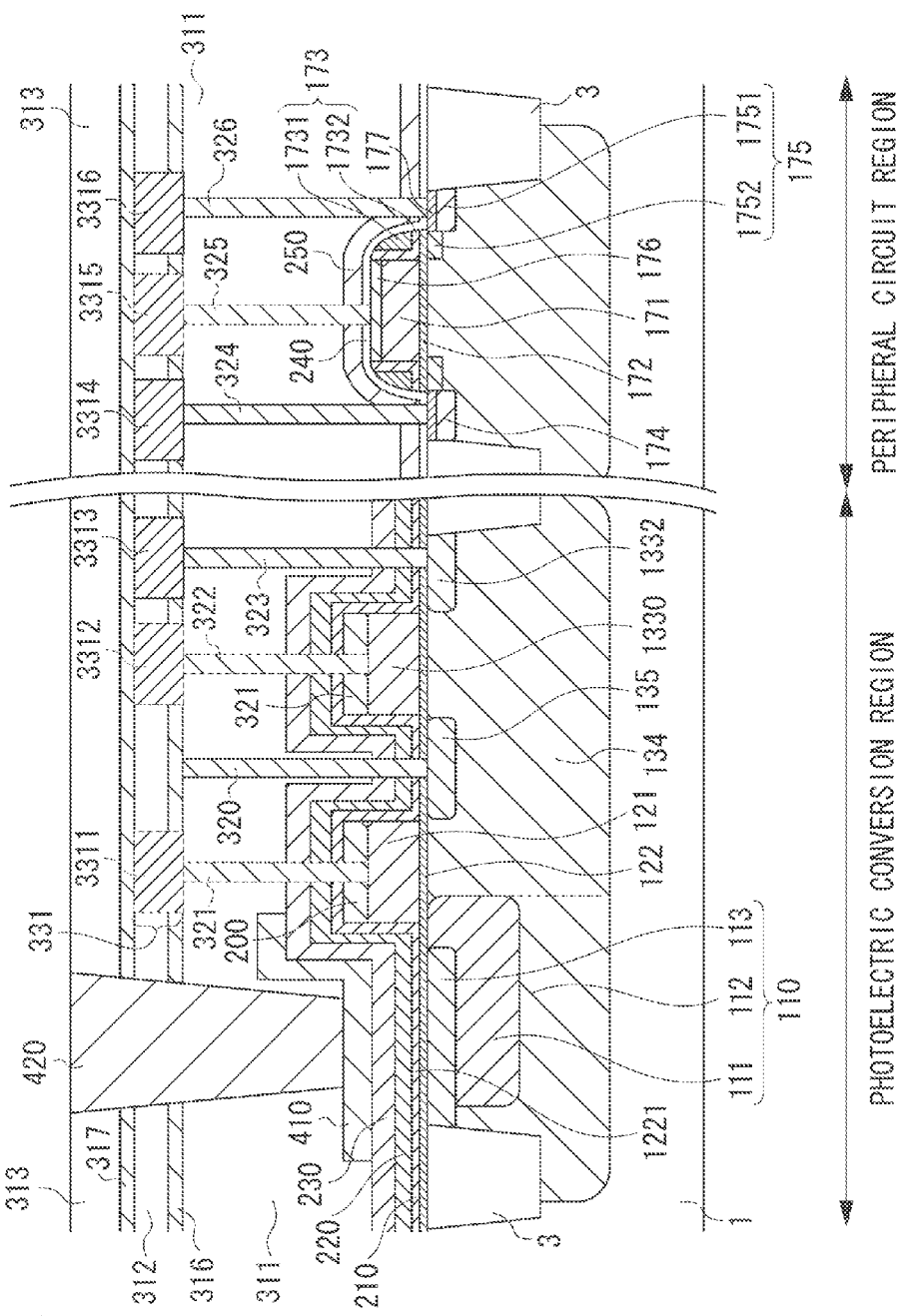
FIG. 6B is a schematic cross-sectional view for illustrating an example of a photoelectric conversion unit according to a sixth exemplary embodiment.

An example of a sixth exemplary embodiment of the photoelectric conversion device 100 will be described with reference to FIG. 6B. The present exemplary embodiment differs from the first exemplary embodiment in that a light guide member 420 is provided on the photoelectric conversion part 110. The light guide member 420 is surrounded by the insulating film 310, and has a refractive index higher than refractive indices of each interlayer insulating layer of the insulating film 310. As a result, it becomes possible to obtain a light guide structure in which the optical path member serves as a core, and the insulating film 310 serves as s clad.

The typical interlayer insulating layer is made of silicon oxide, and a resin, or a resin in which high-refractive index inorganic particles are scattered, silicon nitride-oxide or silicon nitride may be used as the material for the light guide member 420. In this example, the light guide member 420 uses the silicon nitride of which refractive indices are distributed within a range of 1.83 through 2.03.

While aluminum is used as material for the wiring layer in the first exemplary embodiment, copper is used as material for wiring layer in the present exemplary embodiment. If copper is used, anti-diffusion layer such as the silicon nitride for suppressing diffusion of copper may be arranged between the interlayer insulating layers. Since the anti-diffusion layer may be obstructive to the light entering the photoelectric conversion part 110, the light guide member 420 is provided so that it penetrates the anti-diffusion layer. As a result, losses of the light caused by the anti-diffusion layer may be reduced, and sensitivity may be enhanced.

The insulating film 310 includes the anti-diffusion layer. However, if the anti-diffusion layer is thinner than the interlayer insulating layer even when the refractive index of the light guide member 420 is equal to or greater than the refractive index of the anti-diffusion layer, the influence of the anti-diffusion layer is small. Similar to the first exemplary embodiment, even if aluminum is used as material for the wiring layer, dissipation of the light within the insulating film 310 may be suppressed, and sensitivity may be enhanced, by similarly providing the light guide member 420.

Between the photoelectric conversion part 110 and the light guide member 420, a control film 410 which is in contact with the bottom surface of the light guide member 420 is provided. The control film 410 has an area larger than the bottom surface of the light guide member 420, and has an area smaller than the area of the protection film 220. An outer edge portion of the control film 410 is sandwiched by the insulating film 310 and the second protection film 230. The control film 410 has a refractive index higher than the refractive index of the insulating film 310 or the second protection film 230, and typically is made of the silicon nitride.

By making the area of the control film 410 greater than the bottom surface of the light guide member 420, and smaller than the area the protection film 220, diffusion of the light which has propagated within the optical path member may be prevented. The light guide member 420 is, typically, formed by etching the insulating film 310 to provide a recessed portion, and by embedding the material for the light guide member 420 into the recessed portion. The control film 410 may serve as an etching stop film that controls etching to reduce damage to the photoelectric conversion part 110 during formation of the light guide member 420, and may also serve as a stress loosening film.

Figure 7A:
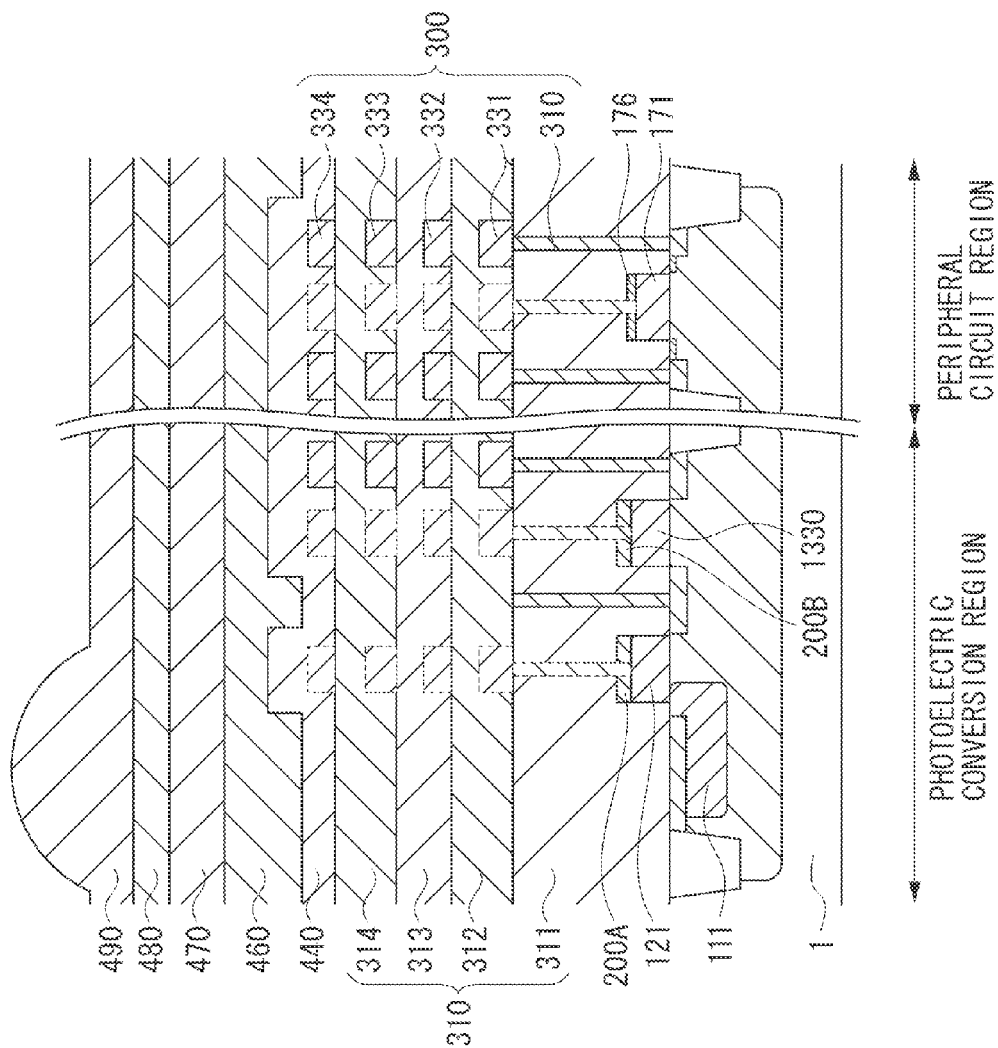
FIG. 7A is a schematic cross-sectional view illustrating an example of the photoelectric conversion device including the photoelectric conversion unit according to the first through fifth exemplary embodiments.

FIG. 7A is a schematic cross-sectional view illustrating an example of the photoelectric conversion device 100 that has adopted the first through fifth exemplary embodiments. In FIG. 7A, for the purpose of simplicity, descriptions of the configurations of the protection film and the intermediate film between the insulating film 310 and the semiconductor substrate 1 have been omitted.

A wiring structure 300 is composed of the insulating film 310 and a plurality of wiring layers (four layers: a first wiring layer 331, a second wiring layer 332, a third wiring layer 333, and a fourth wiring layer 334). In this example, the insulating film 310 is composed of the first interlayer insulating layer 311, the second interlayer insulating layer 312, the third interlayer insulating layer 313, and the fourth interlayer insulating layer 314.

On the wiring structure 300, a passivation film 440 is provided. The typical passivation film 440 includes the silicon nitride layer. On and beneath the silicon nitride layer of the passivation film, the silicon nitride-oxide layer which is thinner than the silicon nitride layer is preferably provided.

On the passivation film 440, a first planarization film 460 made of resin is provided. A top surface of the first planarization film 460 is flat. On the first planarization film 460, a color filter 470 is provided. In this case, one color filter is illustrated, but in the photoelectric conversion region 101, there is a color filter array on the photoelectric conversion part 110.

The color filter array is formed by regularly arraying color filters for a plurality of colors in primary color system or complementary color system according to an arrangement of the photoelectric conversion part 110.

On the color filter 470, a second planarization film 480 made of resin is provided A top surface of the second planarization film 480 is flat. Over the second planarization film 480, a microlens 490 is provided. The microlens 490 may include an anti-reflective coating. In this case, one microlens is illustrated, but in the photoelectric conversion region 101, there is a microlens array formed by regularly arraying a plurality of microlenses according to the arrangement of the photoelectric conversion part 110.

In a case where color filters are provided on the photoelectric conversion part 110, light with a dominant wavelength $\lambda p$ of a color filter corresponding to each photoelectric conversion part 110 is mainly incident on each photoelectric conversion part 110. Therefore, from a practical standpoint, the light incident on the photoelectric conversion part 110 may be regarded as the dominant wavelength $\lambda p$ of the color filter. Therefore, the physical thickness $d_{22}$ of the intermediate member 200, the optical thickness $T_1$ and the physical thickness $D_1$ of the first region 11, and the optical thickness $T_2$ and the physical thickness $D_2$ of the second region 22 may be set based on the dominant wavelength $\lambda p$ of the color filter.

In other words, $T_1 < T_2 < \lambda/2 - T_1$ needs not be satisfied for every wavelength $\lambda$ incident on the photoelectric conversion part 110. Further, $T_1 < T_2 < \lambda/2 - T_1$ is preferably satisfied for all the photoelectric conversion parts 110 provided in the photoelectric conversion region. However, with respect to the photoelectric conversion part 110 on which a color filter having a particular dominant wavelength $\lambda p$ is provided, the photoelectric conversion unit 102 corresponding to the color filter does not need to satisfy $T_1 < T_2 < \lambda p/2 - T_1$.

The optical thickness $T_1$ and the physical thickness $D_1$ of the first region 11, and the optical thickness $T_2$ and the physical thickness $D_2$ of the second region 22 may be also varied, according to a wavelength of the light incident on the photoelectric conversion part 110, for each corresponding transfer gate 120.

Figure 7B:
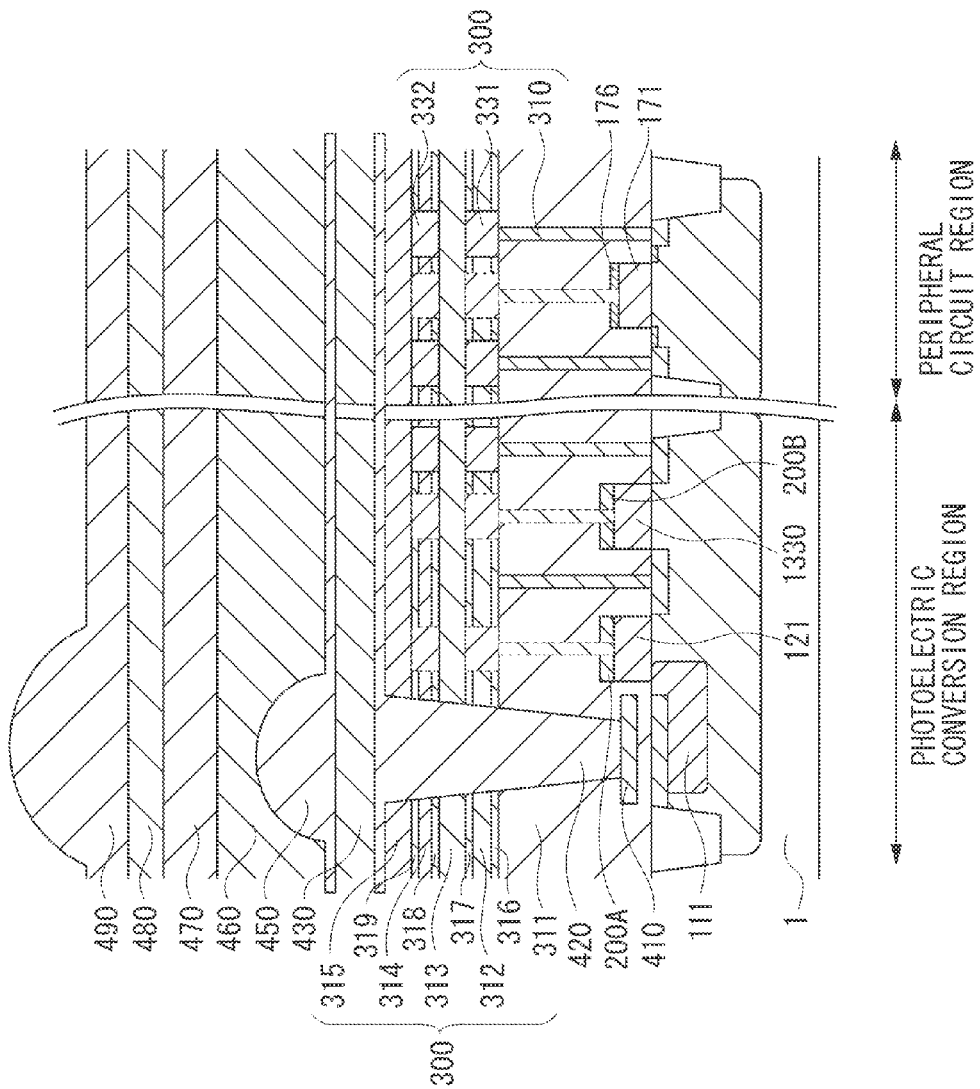
FIG. 7B is a schematic cross-sectional view illustrating an example of the photoelectric conversion device including the photoelectric conversion unit according to the sixth exemplary embodiment the photoelectric conversion unit.

FIG. 7B is a schematic cross-sectional view illustrating an example of the photoelectric conversion device 100 which has adopted the sixth exemplary embodiment. In FIG. 7B, for the purpose of simplification, descriptions of the configurations of the protection film and the intermediate film between the insulating film 310 and the semiconductor substrate 1 have been omitted. The wiring structure 300 is composed of the insulating film 310 and a plurality of wiring layers (two layers: the first wiring layer 331, the second wiring layer 332). In this example, the insulating film 310 includes the first interlayer insulating layer 311, the second interlayer insulating layer 312, the third interlayer insulating layer 313, the fourth interlayer insulating layer 314, and the fifth interlayer insulating layer 315.

Further, the insulating film 310 includes a first interlayer separation layer 316, a second interlayer separation layer 317, a third interlayer separation layer 318, and a fourth interlayer separation layer 319. Each interlayer insulating layer is preferably made of the silicon oxide. Each interlayer separation layer is preferably made of the silicon nitride. The interlayer separation layer suppresses diffusion of metal material of the wiring layer, and serves as an etching stopper during formation of the wiring layer. The interlayer separation layer is preferably thinner than the interlayer insulating layer.

The light guide member 420 surrounded by the insulating film 310 is provided. The light guide member 420 has the interlayer insulating layers 311 through 315 of the insulating film 310 which show a high refractive index. The light guide member 420 forms an optical waveguide structure using the interlayer insulating layers 311 through 315 as a clad, and the light guide member 420 as a core. The light guide member 420 extends to the top surface of the insulating film 310, but may not extend. The light guide member 420 is preferably made of the silicon nitride.

A low refractive index film 430 is provided on the light guide member 420. On the low refractive index film 430 an inner-layer lens 450 is provided. The inner-layer lens 450 may have anti-reflective coating. In the photoelectric conversion region 101, an inner-layer lens array is configured such that a plurality of inner-layer lenses is formed, which are regularly arrayed according to the arrangement of the photoelectric conversion part 110. The inner-layer lens 450 is preferably made of the silicon nitride.

The low refractive index film 430 has the refractive index lower than the refractive index of the inner-layer lens 450. Accordingly, a light incident obliquely from the inner-layer lens 450 on the low refractive index film 430 may be collected toward the light guide member 420, by refraction within the low refractive index film 430. The typical low refractive index film 430 includes the silicon oxide layer.

The low refractive index film preferably has the intermediate refractive index layer having a refractive index between the silicon oxide layer and the light guide member 420, at a position between the silicon oxide layer and the light guide member 420. The low refractive index film 430 preferably has the intermediate refractive index layer having a refractive index between the silicon oxide layer and the inner-layer lens 450, at a position between the silicon oxide layer and the inner-layer lens. These intermediate refractive index layers of the low refractive index film 420 may suppress reflections between the silicon oxide layer and the light guide member 420 or between the silicon oxide layer and the inner-layer lens 450.

In a case where the light guide member 420 or the inner-layer lens 450 is made of the silicon nitride, the intermediate refractive index layer is preferably made of the silicon nitride-oxide. The intermediate refractive index layer is preferably thinner than the silicon oxide layer.

On the inner-layer lens 450, the first planarization film 460 made of resin is provided, and the top surface of the first planarization film 460 is flat. On the first planarization film 460, the color filter 470 is provided. In FIG. 7B, only one color filter is illustrated, but in the photoelectric conversion region 101, there is a color filter array composed of color filters for a plurality of colors.

On the color filter 470, the second planarization film 480 made of resin is provided, and the top surface of the second planarization film 480 is flat. On the second planarization film 480, the microlens 490 is provided. The microlens 490 may include an anti-reflective coating. In FIG. 7B, only one microlens is illustrated, but in the photoelectric conversion region 101, a microlens array is configured of a plurality of microlenses.

Further, the photoelectric conversion device 100 may be also configured as a so-called back side illumination type. In the photoelectric conversion device of that type, the color filter array, the microlens array, and the inner-layer lens array are arranged on a side opposite to the insulating film 310, relative to the semiconductor substrate 1.

The present embodiment is suitable for the photoelectric conversion device 100 of a so-called front side illumination type as already described, but there is a possibility that the backside illumination type semiconductor device may also present problems similar to the photoelectric conversion device 100 of the front side illumination type. This is because the semiconductor substrate 1 is very thin and 1 through 10 μm thick, a light which has passed through the semiconductor substrate 1 exerts influence on an operation of the transfer gate 120.

An imaging system may be constructed using the photoelectric conversion device 100 described hereinabove. The imaging system may include cameras such as, for example, a still camera or a video camera. Also, the imaging system may include information terminals having camera functions. The imaging system may be provided with at least one of an image processing unit such as an image processing engine that processes an image based on an electrical signal generated by the signal generation part 130 and an image display unit such as a liquid crystal display that displays the image.

A manufacturing method of the above-described photoelectric conversion device 100 will be described. For the purpose of simplicity, the protection film 220 and the third protection film 250 are made of the silicon nitride film, the first intermediate film 210 and the second intermediate film 240, and the second protection film 230 are made of the silicon oxide film, and the intermediate member 200 is made of the silicon oxide will be described.

First, a manufacturing method for the photoelectric conversion device 100 according to the first exemplary embodiment will be described. On the semiconductor substrate 1, the polysilicon film is formed. On the polysilicon film formed is the first silicon oxide film. Over the first silicon oxide film the photo resist film is coated, and the photo resist film is patterned to have a shape of each gate electrode. With the patterned photo resist film, the first silicon oxide film is patterned. Thus, the hard mask is formed on the polysilicon film. Each gate electrode including the transfer gate electrode 121 is formed by patterning the polysilicon film using the hard mask.

The hard mask provided on the transfer gate electrode turns out to be the intermediate member 200. Thereafter, the photoelectric conversion part 110 is formed. The second silicon oxide film is formed so as to cover substantially the entire surface of the semiconductor substrate 1. The first silicon nitride film is formed so as to cover substantially the entire surface of the second silicon oxide film. The second silicon oxide film turns out to be the first intermediate film 210 in the photoelectric conversion region 101, and the first silicon nitride film turns out to be the protection film 220.

By sequentially performing etching on the first silicon nitride film and the second silicon oxide film, in the peripheral circuit region 103, the first silicon nitride film turns out to be the first dielectric layer 1731 of the side wall spacer 173, and the second silicon oxide film turns out to be the second dielectric layer 1732 of the side wall spacer 173. A third silicon oxide film is formed so as to cover substantially the entire surface of the semiconductor substrate 1. The second silicon oxide film turns out to be the second protection film 230 in the photoelectric conversion region 101.

Etching is performed on the third silicon oxide film in the peripheral circuit region 103 to remove the third silicon oxide film. During the process of forming the side wall spacer 173 and/or after performing etching the third silicon oxide film, the hard mask provided in the peripheral circuit region 103 is removed. Accordingly, the source and drain of the peripheral transistor, and the top surface 1210 of the peripheral gate electrode 171 are exposed. A metal film which may be silicided such as cobalt covering substantially the entire surface of the semiconductor substrate 1 is formed. By using the third silicon oxide film which is left in the photoelectric conversion region 101 as a mask, these surfaces are silicided by reacting the source/drain exposed in the peripheral circuit region 103 and the transfer gate electrode 121 with the metal film.

Thereafter, the second intermediate film 240 is made by forming a fourth silicon oxide film, which covers substantially the entire surface of the semiconductor substrate 1. By forming a second silicon nitride film, which covers substantially the entire surface of the semiconductor substrate 1, the second silicon nitride film is removed in the photoelectric conversion region 101. The second silicon nitride film left in the peripheral circuit region 103 is the third protection film 250. Thereafter, the first interlayer insulating layer 311 is formed.

By using the third protection film 250 as an etching stop film for self-aligned contact, a contact plug may be formed in the peripheral circuit region 103. Then, the photoelectric conversion device 100 may be manufactured by using known multilayer wiring technique, color filter forming technique, or microlens forming technique.

Next, a manufacturing method for the photoelectric conversion device 100 according to the second exemplary embodiment illustrated in FIG. 5A will be described. After forming the polysilicon film, the polysilicon film is patterned using the photo resist mask. The extension part 1221 of the transfer gate insulating film 122 is also removed, and the photo resist mask is removed. Thereafter, the first silicon oxide film as the first intermediate film 210 is formed. The first intermediate film 210 may be also formed by depositing the silicon oxide film, or may be formed by thermally oxidizing surfaces of the semiconductor substrate 1 and the transfer gate electrode 121.

Next, the intermediate member 200 composed of the second silicon oxide film may be formed by further forming the second silicon oxide film on the transfer gate electrode 121, and patterning the second silicon oxide film. Thereafter, the silicon nitride film may be formed as the protection film 220.

Figure 5B:
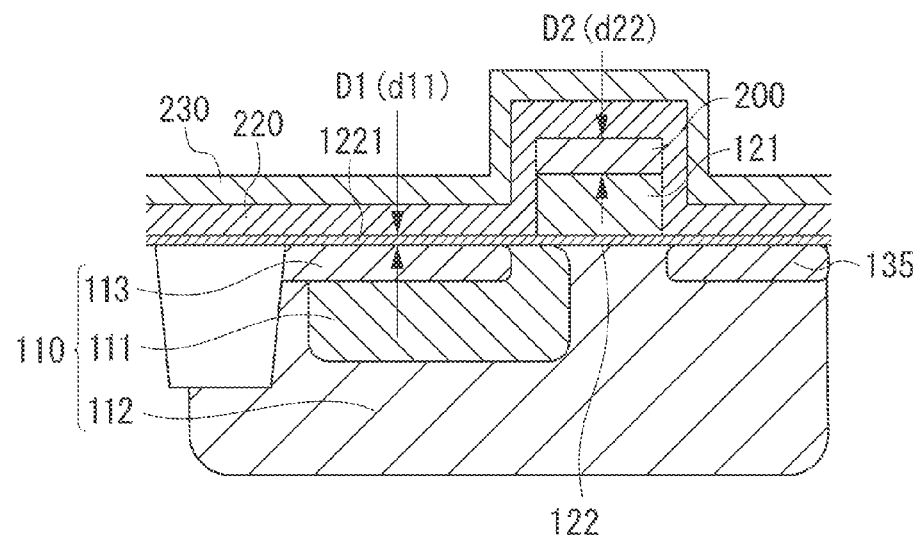
FIG. 5B is a schematic cross-sectional view for illustrating the proximity of a transfer gate according to a third exemplary embodiment.

A manufacturing method for the photoelectric conversion device 100 according to the third exemplary embodiment illustrated in FIG. 5B is similar to the above-described manufacturing method for the photoelectric conversion device 100 according to the first exemplary embodiment, except that the first intermediate film 210 is not formed, and therefore descriptions thereof will not be repeated.

Figure 5C:
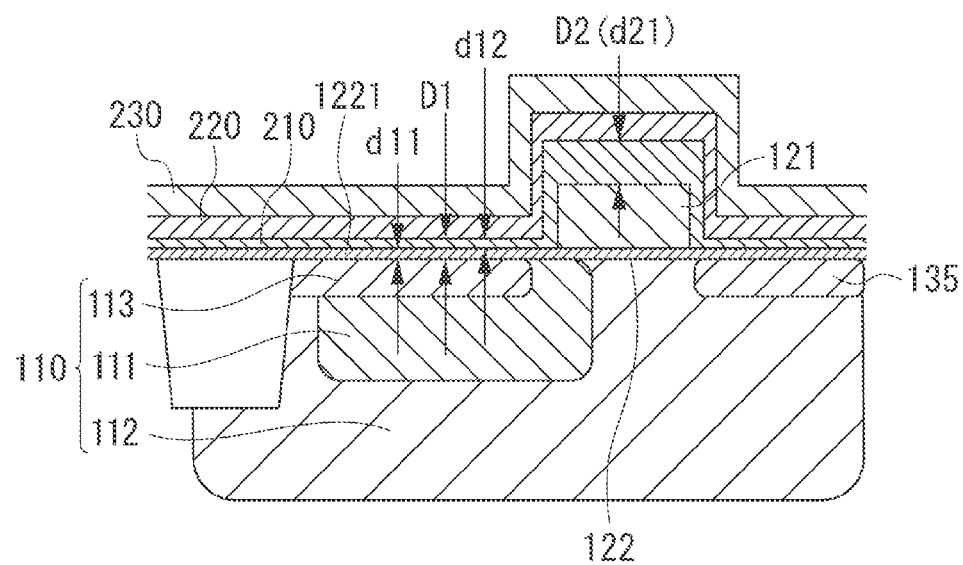
FIG. 5C is a schematic cross-sectional view for illustrating the proximity of a transfer gate according to a fourth exemplary embodiment.
Figure 5D:
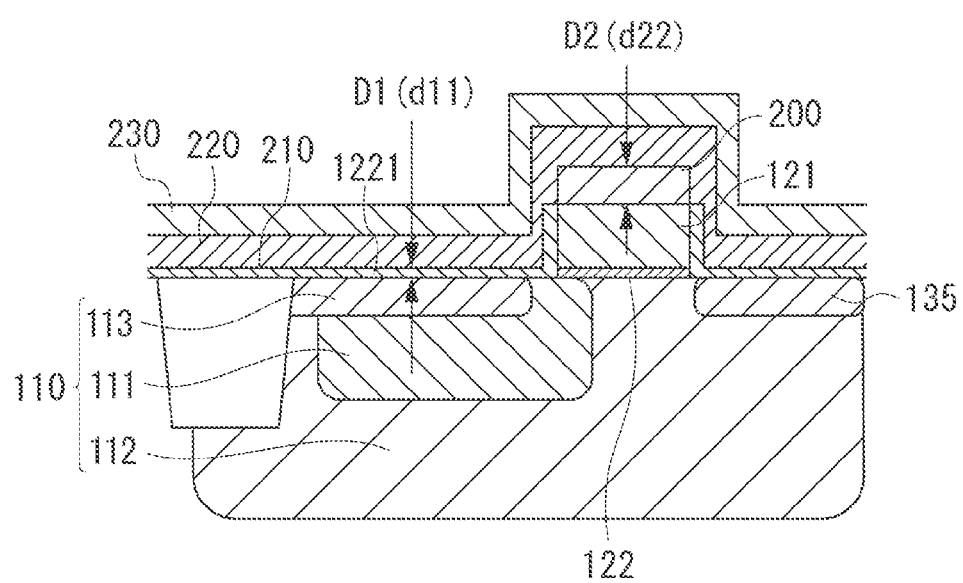
FIG. 5D is a schematic cross-sectional view for illustrating the proximity of a transfer gate according to a fifth exemplary embodiment.

A manufacturing method for the photoelectric conversion device 100 according to the fourth exemplary embodiment illustrated in FIG. 5C may be performed in the manner similar to the manufacturing method for the photoelectric conversion device 100 according to the second exemplary embodiment up to formation of the transfer gate electrode 121. The first silicon oxide film is formed, and a portion over the photoelectric conversion part 110 of the first silicon oxide film is made thinner than a portion over the top surface 1210 of the transfer gate electrode 121. In this way, the first silicon oxide film which has been made partially thin may be used as the first intermediate film 210.

In the present exemplary embodiment, as described in the first exemplary embodiment, the first region 11 forms an interface boundary with the photoelectric conversion part 110, and the second region 22 forms an interface boundary with the top surface 1210 of the transfer gate electrode 121. In the present exemplary embodiment, the refractive indices of the transfer gate electrode 121 and the photoelectric conversion part 110 are set to 3.4. Three cases where wavelengths λ of incident lights entering the photoelectric conversion part 110 are 400 nm, 550 nm, and 800 nm are presumed. Then, two cases where the refractive indices of the entire of the first region 11 or the second region 22 are 1.40 and 1.80 are presumed.

Figure 8:
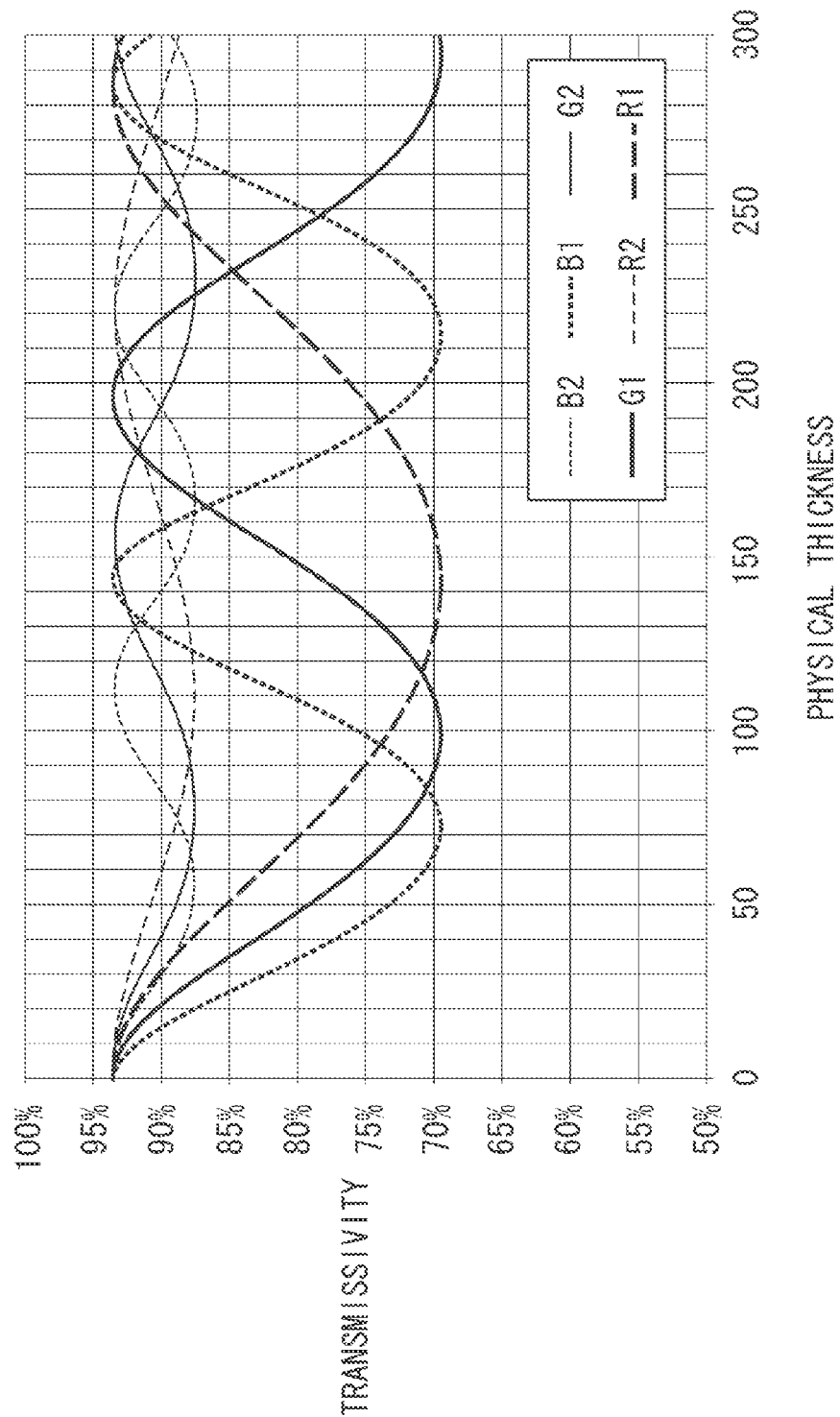
FIG. 8 illustrates a relationship between a physical thickness and a transmissivity.

Then, FIG. 8 illustrates the results of obtaining transmissivity of the light from the protection film 220 to the photoelectric conversion part 110 or transmissivity of the light from the protection film 220 to the transfer gate electrode 121, with physical thicknesses of the first region 11 or the second region 22 on the horizontal axis, with respect to six combinations of wavelengths λ and refractive indices.

A line B1 is a combination of a wavelength of 400 nm, and a refractive index of 1.40, a line B2 is a combination of a wavelength of 400 nm, and a refractive index of 1.80. A line G1 is a combination of a wavelength of 550 nm, and a refractive index of 1.40, a line G2 is a combination of a wavelength of 550 nm, and a refractive index of 1.80. A line R1 is a combination of a wavelength of 800 nm, and a refractive index of 1.40, and a line R2 is a combination of a wavelength of 800 nm, and a refractive index of 1.80.

FIG. 8 will be described. In a case where the first region 11 is not present and a physical thickness of the first region 11 is zero, and the protection film 220 and the photoelectric conversion part 110 are in contact with each other, the transmissivity becomes about 93%. Then, for example, when an optical thickness of the first region 11 is increased starting from zero, and the optical thickness becomes λ/4, the transmissivity becomes minimal (about 69%). In FIG. 8, this corresponds to a case where a trough of sinusoidal line G1 corresponding to a case when λ is 550 nm, and a refractive index of the region is 1.40, is located around the physical thickness which becomes about 98 nm (≈550÷1.40÷4).

When an optical thickness of the region is further increased from λ/4 and optical thickness becomes λ/2, the transmissivity becomes again maximal (about 93%). In FIG. 8, this corresponds to a case where a crest of the line G1 is located around the physical thickness of the region which becomes 196 nm (≈550÷1.40÷2). In a similar manner, when the optical thickness is further increased, a crest appears in increments of Mo×λ/4, and a trough appears in increments of Me×λ/4, where Mo is odd number and Me is even number. What is handled in the present embodiment is the process until the first crest appears where the optical thickness is in a range of more than zero and less than λ/2.

Not only the line D, but also every line is symmetrical, with its symmetry center on the trough. As a result, assuming that a predetermined transmissivity is obtained when an optical thickness of the low refractive index region is T, then the transmissivity becomes equal to the predetermined transmissivity when the optical thickness is λ/2−T. When the optical thickness is greater than T and smaller than λ/2−T, a transmissivity becomes lower than the predetermined transmissivity. Therefore, when the optical thickness $T_1$ of the first region 11 is the above-described D and a transmissivity with respect to the photoelectric conversion part 110 is equal to the predetermined transmissivity, a transmissivity to the transfer gate electrode 121 may be made equal to or less than the predetermined transmissivity, by making the optical thickness $T_2$ of the second region 22 greater than T and less than λ/2−T. From this fact, $T_1 < T_2 < \lambda/2 - T_1$ is derived.

In FIG. 8, a case where the refractive index is 1.80 and a case where the refractive index is 1.40 are illustrated. However, for example, a case where the refractive index of the low refractive index region is 1.60, or a case where a region of 1.40 and a region of 1.80 are mixed is also conceivable. In these cases, it may be considered that a trough appears in a range between about 76 nm (≈550÷1.80÷4) which yields the first trough of sinusoidal line G2 corresponding to a case where λ is 550 nm and the refractive index of the region is 1.80, and about 98 nm which yields the first trough of the line G1.

In a case where a wavelength of a light incident on the photoelectric conversion part 110 is visual light (wavelength is 400 nm through 800 nm), from a positional relationship among the line R1 and the line G1 and the line B1, and a positional relationship among the line R2 and the line G2 and the line B2, it may be considered that a line on which a crest appears first is the line B2. Therefore, if $T_1 < T_2 < \lambda/2 - T_1$ is satisfied regarding the line B2, the transmissivity with respect to the transfer gate electrode 121 may be made lower than the transmissivity with respect to the photoelectric conversion part 110. If the low refractive index region is composed of at least one of the silicon oxide and the silicon nitride-oxide, the low refractive index region shows a refractive index of 1.40 or more and 1.80 or less.

In a case where the transfer gate electrode 121 is made of polysilicon, and the photoelectric conversion part 110 is made of the silicon, absorption of light is more likely to occur at long wavelengths than at short wavelengths. It is preferable that the more incident light enters the photoelectric conversion part 110, and the less incident light enters the transfer gate electrode 121. Accordingly, it is desirable that a transmissivity of short wavelength light is high with respect to the photoelectric conversion part 110. Further, it is desirable that a transmissivity of long wavelength light is high with respect to the transfer gate electrode 121.

From the fact that each line is sinusoidal, change in the transmissivity becomes maximal around when the optical thicknesses of the low refractive index region is $\lambda/8$ and $3\lambda/8$, which may be expressed as $Mo \times \lambda/8$. Mo is odd number. Around that region, the physical thickness takes an intermediate value of the physical thicknesses when the physical thickness of the low refractive index region becomes a crest and a trough of the line illustrated in FIG. 8. Therefore, the optical thickness of the first region 11 should be $\lambda/8$ or less with respect to short wavelength light. The optical thickness of the second region 22 may be greater than $\lambda/8$ and smaller than $3/8\lambda$ to long wavelength light.

The optical thickness of the low refractive index region becomes $\lambda/8$ regarding the line B1 when the physical thickness is about 35 nm ($\approx 400 \div 1.4 \div 8$). The optical thickness of the low refractive index region becomes $3\lambda/8$ when the physical thickness is about 107 nm ($\approx 3 \times 400 \div 1.4 \div 8$).

The optical thickness of the low refractive index region becomes $\lambda/8$ regarding the line B2 when the physical thickness is about 28 nm ($\approx 400 \div 1.8 \div 8$). The optical thickness of the low refractive index region becomes $3\lambda/8$ when the physical thickness is about 83 nm ($\approx 3 \times 400 \div 1.8 \div 8$).

The optical thickness of the low refractive index region becomes $\lambda/8$ regarding the line R1 when the physical thickness is about 71 nm ($\approx 800 \div 1.4 \div 8$). The optical thickness of the low refractive index region becomes $3\lambda/8$ when the physical thickness is about 214 nm ($\approx 3 \times 800 \div 1.4 \div 8$).

The optical thickness of the low refractive index region becomes $\lambda/8$ regarding the line R2 when the physical thickness is about 56 nm ($\approx 800 \div 1.8 \div 8$). The optical thickness of the low refractive index region becomes $3\lambda/8$ when the physical thickness is about 167 nm ($\approx 3 \times 800 \div 1.8 \div 8$).

Therefore, if the physical thickness $D_1$ of the first region 11 is 35 nm or less, a transmissivity with respect to the photoelectric conversion part 110 may be made as high as possible. Further, if the physical thickness $D_2$ of the second region 22 is smaller than 167 nm, a transmissivity of long wavelength light with respect to the photoelectric conversion part 110 may be made as low as possible. Furthermore, if the physical thickness $D_2$ of the second region 22 is smaller than 83 nm, transmissivities of long wavelength and short wavelength light with respect to the photoelectric conversion part 110 may be made as low as possible. The physical thickness $D_2$ of the second region 22 may be greater than the physical thickness $D_1$ of the first region 11, but the physical thickness $D_2$ of the second region 22 is preferably greater than 28 nm.

From FIG. 8, it is understood that, from comparisons between the lines R1 and R2, between the lines G1 and G2, and between the lines B1 and B2, a low refractive index region with a low refractive index creates greater change of transmissivity than the one with a high refractive index. Therefore, if the majority of materials which form the low refractive index region is the silicon oxide, existence of the silicon nitride-oxide may be neglected. It is preferable that the low refractive index region is composed of at least silicon oxide since the transmissivity may be made lower.

From practical viewpoint, in a case where the physical thickness $d_{22}$ of the intermediate member 200 which constitutes the second region 22 is thicker than the physical thickness $D_1$ of the first region 11 and the intermediate member 200 is made of silicon oxide, the existence of the silicon nitride-oxide may be neglected. In view of the fact that a minimum value of the transmissivities is 87% assuming that the refractive index of the low refractive index region is 1.80, the refractive index of the transmissivity may be made less than 87% when the refractive index of the low refractive index region is 1.40. Thus, the transmissivity of the first region 11 is made equal to or greater than 87%, and the transmissivity of the second region 22 is made less than 87%.

If the light wavelength of 550 nm at which human eyes are said to be most sensitive is regarded as a boundary between short wavelength and long wavelength, the condition that the transmissivity is less than 87%, may be desirable regarding the line G1. In FIG. 8, the transmissivity becomes less than 87% regarding the line G1 in the case where the physical thickness of the low refractive index region is greater than 30 nm and smaller than 165 nm. In other words, in a case where the physical thickness $d_{22}$ of the intermediate member 200 is thicker than the physical thickness of the first region 11 and the intermediate member 200 is made of silicon oxide, a physical thickness of the second region 22 is preferably larger than 30 nm and smaller than 165 nm while the physical thickness of the first region 11 is equal to or smaller than 30 nm.

Based on the above studies, the transfer gate insulating film 122 with a physical thickness of 8 nm, having a silicon oxide layer with a physical thickness of 4.5 nm and a silicon nitride-oxide layer with a physical thickness of 3.5 nm is formed, and the transfer gate electrode 121 made of polysilicon with a physical thickness $D_g$ of 250 nm is formed.

The extension part 1221 is formed such that the silicon nitride-oxide layer is 2 nm thinner than the transfer gate insulating film 122, and its physical thickness $d_{11}$ is 6 nm. The physical thickness $d_{22}$ of the intermediate member 200 made of silicon oxide is 40 nm, and the physical thicknesses $d_{12}$ and $d_{21}$ of the first intermediate film 210 made of silicon oxide are 10 nm. The physical thickness $D_p$ of the protection film 220 made of silicon nitride is 50 nm. In other words, the physical thickness $D_1$ of the first region 11 is 14.5 nm, and the physical thickness $D_2$ of the second region 22 is 50 nm.

The film is formed under the condition that a refractive index of silicon oxide is 1.46, a refractive index of silicon nitride-oxide is 1.73, and a refractive index of silicon nitride is 2.00. Therefore, the optical thickness $T_1$ of the first region 11 is 9.2 nm, and the optical thickness $T_2$ of the second region 22 is 73 nm.

A color filter array with a Bayer array pattern consisting of a blue color filter, a green color filter, and a red color filter is arranged in the photoelectric conversion region 101. The blue color filter mainly transmits a blue light of 450 nm in wavelength, a green color filter mainly transmits a green light of 550 nm in wavelength, and a red color filter mainly transmits a red light of 620 nm in wavelength. As a result, virtually, an incident light entering the photoelectric conversion part 110 is deemed to be limited to 450 nm or 550 nm or 620 nm.

Optical thickness ($\lambda/4$) is 113 nm, 138 nm, and 155 nm, when the transmissivity becomes minimal with respect to each incident light of 450 nm, 550 nm, and 620 nm in wavelengths. Optical thickness ($\lambda/8$) is 57 nm, 69 nm, and 76 nm, when change of the transmissivity becomes maximal with respect to each incident light of 450 nm, 550 nm, and 620 nm in wavelengths. When photographing was performed using such a photoelectric conversion device 100, a good image could be obtained.

While the embodiments have been described with reference to exemplary embodiments, it is to be understood that the disclosure is not limited to the disclosed exemplary embodiments. The scope of the following claims is to be accorded the broadest interpretation so as to encompass all modifications, equivalent structures, and functions.

This application claims priority from Japanese Patent Application No. 2011-223292 filed Oct. 7, 2011, which is hereby incorporated by reference herein in its entirety.

What is claimed is:

1. A photoelectric conversion device comprising:
a photoelectric conversion part provided in a semiconductor substrate;
a signal generation part configured to generate an electrical signal based on a signal charge generated by the photoelectric conversion part; and
a transfer gate configured to transfer a signal charge to the signal generation part from the photoelectric conversion part; and
a continuous film configured to cover the photoelectric conversion part, and to cover a top surface of a gate electrode of the transfer gate,
wherein a first region is provided between the continuous film and the photoelectric conversion part, the first region being configured to have a refractive index lower than refractive indices of the continuous film and the photoelectric conversion part, and to form an interface boundary with the continuous film, and
wherein a second region is provided between the continuous film and the top surface of the gate electrode, the second region being configured to have a refractive index lower than refractive indices of the gate electrode and the continuous film, and to form an interface boundary with the continuous film, and
wherein $T_2$ is greater than $T_1$ and less than $\lambda/2-T_1$ where an optical thickness of the first region is $T_1$, an optical thickness of the second region $T_2$, and a wavelength of an incident light entering the photoelectric conversion part is $\lambda$.

2. The photoelectric conversion device according to claim 1, further comprising:
an intermediate member, provided between the continuous film and the top surface of the gate electrode, without extending between the continuous film and a side surface on the photoelectric conversion part side of the gate electrode of the transfer gate, and configured to have a refractive index lower than refractive indices of the continuous film and the photoelectric conversion part,
wherein the second region includes the intermediate member.

3. The photoelectric conversion device according to claim 1, further comprising:
an intermediate film, provided between the semiconductor substrate and the continuous film, configured to cover the photoelectric conversion part and the top surface of the gate electrode, and to have a refractive index lower than refractive indices of the continuous film and the photoelectric conversion part,
wherein the first region includes a portion located between the intermediate film and the photoelectric conversion part, of the continuous film, and
wherein the second region includes a portion of the intermediate film, located between the continuous film and the top surface of the gate electrode.

4. The photoelectric conversion device according to claim 1, satisfying at least one of the following requirements (a), (b), and (c):
(a) $T_1$ is less than or equal to $\lambda/8$, and, $T_2$ is greater than or equal to $\lambda/8$, and less than or equal to $3\lambda/8$
(b) $T_2$ is less than or equal to $\lambda/4$
(c) $T_2$ is greater than or equal to $2 \times T_1$.

5. A photoelectric conversion device comprising:
a photoelectric conversion part provided on a silicon substrate;
a signal generation part configured to generate an electrical signal based on a signal charge generated by the photoelectric conversion part;
a transfer gate configured to transfer the signal charge to the signal generation part from the photoelectric conversion part; and
a color filter provided on the photoelectric conversion part; and
a silicon nitride film configured to cover the photoelectric conversion part, and to cover a top surface of a gate electrode of the transfer gate which is made of polysilicon,
wherein a first region composed of at least one of silicon oxide and silicon nitride-oxide, and configured to form an interface boundary with the silicon nitride film, is provided between a portion that covers the photoelectric conversion part of the silicon nitride film and the photoelectric conversion part, and
wherein a second region composed of at least one of silicon oxide and silicon nitride-oxide, and configured to form an interface boundary with the silicon nitride film, is provided between the silicon nitride film and the top surface of the gate electrode, and
wherein $D_1 \leq 28$ nm and $D_1 < D_2 < 167$ nm are satisfied where a physical thickness of the first region is $D_1$, and a physical thickness of the second region is $D_2$.

6. The photoelectric conversion device according to claim 5, further comprising:
an intermediate member, provided between the silicon nitride film and the top surface of the gate electrode, without extending between the silicon nitride film and a side surface on the photoelectric conversion part side of the gate electrode of the transfer gate,
wherein the second region includes the intermediate member.

7. The photoelectric conversion device according to claim 6, wherein the intermediate member is made of silicon oxide.

8. The photoelectric conversion device according to claim 5, further comprising:
an intermediate film, provided between the silicon substrate and the silicon nitride film, configured to cover the photoelectric conversion part and to cover the top surface of the gate electrode, wherein the first region includes a portion of the intermediate film located between the silicon nitride film and the photoelectric conversion part, and wherein the second region includes a portion of the intermediate film located between the silicon nitride film and the top surface of the gate electrode.

9. The photoelectric conversion device according to claim 1, wherein the first region includes a portion of a gate insulating film of the transfer gate which extends from between the gate electrode and the substrate to cover the photoelectric conversion part.

10. The photoelectric conversion device according to claim 5, wherein the first region includes a portion of the gate insulating film of the transfer gate which extends from between the gate electrode and the substrate to cover the photoelectric conversion part.

11. The photoelectric conversion device according to claim 2, wherein an optical thickness of the intermediate member is greater than an optical thickness of the first region.

12. The photoelectric conversion device according to claim 6, wherein a physical thickness of the intermediate member is greater than a physical thickness of the first region.

13. The photoelectric conversion device according to claim 2, wherein a bottom surface of the intermediate member is in contact with the top surface of the gate electrode, and a length of the bottom surface of the intermediate member in a transfer direction of the transfer gate is equal to a length of the top surface of the gate electrode in the transfer direction and is greater than a physical thickness of the intermediate member.

14. The photoelectric conversion device according to claim 5, wherein a bottom surface of the intermediate member is in contact with the top surface of the gate electrode, and a length of the bottom surface of the intermediate member in a transfer direction of the transfer gate is equal to a length of the top surface of the gate electrode in the transfer direction and is greater than a physical thickness of the intermediate member.

15. The photoelectric conversion device according to claim 1, wherein a light guide member surrounded by an insulating film covering the substrate and having a refractive index higher than a refractive index of the insulating film, is provided on the photoelectric conversion part.

16. The photoelectric conversion device according to claim 1, further comprising:
a signal processing unit configured to process the electrical signal generated by the signal generation part,
wherein a transistor of the signal processing unit satisfies at least one of the following requirements (i), (ii), (iii), (iv) and (v):
(i) a drain of the transistor is covered with a silicide layer,
(ii) a top surface of a gate electrode of the transistor is covered with a silicide layer,
(iii) the transistor has a side wall spacer, and the side wall spacer includes a first dielectric layer and a second dielectric layer provided between the first dielectric layer and the gate electrode of the transistor and having a dielectric constant lower than that of the first dielectric layer,
(iv) a gate electrode of the transistor and the gate electrode of the transfer gate are made of similar conductivity-type polysilicon, and an impurity concentration of the gate electrode of the transistor is higher than an impurity concentration of the gate electrode of the transfer gate,
(v) a physical thickness of the gate insulating film of the transistor is smaller than a physical thickness of the gate insulating film of the transfer gate.

17. The photoelectric conversion device according to claim 5, further comprising:
a signal processing unit configured to process the electrical signal generated by the signal generation part,
wherein a transistor of the signal processing unit satisfies at least one of the following requirements (i), (ii), (iii), (iv) and (v):
(i) a drain of the transistor is covered with a silicide layer,
(ii) a top surface of a gate electrode of the transistor is covered with a silicide layer,
(iii) the transistor has a side wall spacer, and the side wall spacer includes a first dielectric layer and a second dielectric layer provided between the first dielectric layer and the gate electrode of the transistor and having a dielectric constant lower than that of the first dielectric layer,
(iv) a gate electrode of the transistor and the gate electrode of the transfer gate are made of similar conductivity-type polysilicon, and an impurity concentration of the gate electrode of the transistor is higher than an impurity concentration of the gate electrode of the transfer gate,
(v) a physical thickness of the gate insulating film of the transistor is smaller than a physical thickness of the gate insulating film of the transfer gate.

18. The photoelectric conversion device according to claim 1, wherein $\lambda$ is greater or equal to 400 nm and less than or equal to 800 nm.

19. An imaging system comprising:
the photoelectric conversion device according to claim 1; and
at least one of an image processing unit configured to process an image based on the electrical signal and an image display unit configured to display an image based on the electrical signal.

20. An imaging system comprising:
the photoelectric conversion device according to claim 5; and
at least one of an image processing unit configured to process an image based on the electrical signal and an image display unit configured to display an image based on the electrical signal.

* * * * *